United States Patent [19]
Arts

[11] Patent Number: 6,084,536
[45] Date of Patent: Jul. 4, 2000

[54] CONVERSION OF A SEQUENCE OF M-BIT INFORMATION WORDS INTO A MODULATED SIGNAL

[75] Inventor: Petrus H. M. Arts, Eindhoven, Netherlands

[73] Assignee: U.S. Philips Corporation, New York, N.Y.

[21] Appl. No.: 08/950,400

[22] Filed: Oct. 14, 1997

[30] Foreign Application Priority Data

Oct. 18, 1996 [EP] European Pat. Off. .............. 96202914

[51] Int. Cl.[7] .................................................. H03M 7/00
[52] U.S. Cl. ........................................................ 341/58
[58] Field of Search ................................ 348/58, 63, 94, 348/95

[56] References Cited

U.S. PATENT DOCUMENTS

| | | | |
|---|---|---|---|
| 4,531,153 | 7/1985 | Watanabe | 358/141 |
| 5,016,258 | 5/1991 | Tanaka et al. | 375/25 |
| 5,365,231 | 11/1994 | Niimura | 341/58 |
| 5,396,239 | 3/1995 | McMahon et al. | 341/58 |
| 5,642,113 | 6/1997 | Schouhamer Immink | 341/58 |
| 5,696,505 | 12/1997 | Schouhamer Immink | 341/59 |
| 5,699,062 | 12/1997 | Widmer | 341/58 |
| 5,764,170 | 6/1998 | Nabeta et al. | 341/95 |
| 5,790,056 | 8/1998 | Schouhamer Immink | 341/58 |

*Primary Examiner*—Michael Tokar
*Assistant Examiner*—Anh Tran
*Attorney, Agent, or Firm*—Gregory L. Thorne

[57] ABSTRACT

A sequence of m-bit information words is converted to a modulated signal wherein each received information word from the sequence is converted to an n-bit code word. The code word is selected from a set of codewords that depends on a coding state that is related to a digital sum value at the end of the part of the modulated signal that corresponds to the delivered code word. By at least one of the digital sum values, a first (S2, S4, S6, S8, S10, S12) or a second (S3, S5, S7, S9, S11, S13) coding state of a pair of coding states is determined. Which of the two coding states of the pair is determined depends on the information word that corresponds to the previously delivered code word. The sets (V2/V3; V4/V5; V6/V7; V8/V9; V10/V11; V12/V13) of codewords belonging to the pairs of coding states contain no codewords in common. In this coding method the number of consecutive bit cells in the modulated signal having the same signal value does not exceed 7, and specific sync words are required for insertion between blocks of the codewords. The modulated signal obtained may be reconverted to information words by assigning an information word to each of the codewords from the sequence in dependence on the code word to be converted and also in dependence on the logical values of bits in the bit string which are positioned at predefined positions relative to the code word.

19 Claims, 17 Drawing Sheets

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 0 | 110101010 | 6 | 110101010 | 4 | 111000001 | 6 | 110101010 | 2 | 111000001 | 4 | 011010000 | 4 | 000001010 | 6 |
| 1 | 110101010 | 7 | 110101010 | 5 | 111000001 | 7 | 110101010 | 3 | 111000001 | 5 | 011010000 | 5 | 000001010 | 7 |
| 2 | 101011010 | 6 | 101011010 | 5 | 111000100 | 6 | 101011010 | 3 | 111000100 | 4 | 101011010 | 1 | 000010010 | 6 |
| 3 | 110011010 | 6 | 110011010 | 5 | 111000100 | 7 | 110011010 | 3 | 111000100 | 5 | 110011010 | 1 | 000010010 | 7 |
| 4 | 110010110 | 6 | 110010110 | 5 | 111001000 | 6 | 110010110 | 3 | 111001000 | 4 | 110010110 | 1 | 000100010 | 6 |
| 5 | 101010110 | 6 | 101010110 | 5 | 111001000 | 7 | 101101010 | 3 | 111001000 | 5 | 101101010 | 1 | 000100010 | 7 |
| 6 | 101100110 | 6 | 101100110 | 5 | 000110111 | 4 | 101100110 | 3 | 000110111 | 2 | 101100110 | 1 | 001000010 | 6 |
| 7 | 101010110 | 6 | 101010110 | 5 | 000110111 | 5 | 101010110 | 3 | 000110111 | 3 | 101010110 | 1 | 001000010 | 7 |
| 8 | 111101011 | 2 | 110100011 | 5 | 000111011 | 4 | 110100011 | 3 | 000111011 | 2 | 110100011 | 1 | 010000010 | 6 |
| 9 | 111101011 | 3 | 110010011 | 5 | 000111011 | 5 | 110010011 | 3 | 000111011 | 3 | 110010011 | 1 | 010000010 | 7 |
| 10 | 011110010 | 6 | 110001110 | 5 | 000111010 | 4 | 110001110 | 3 | 011110010 | 2 | 110001110 | 1 | 000001111 | 2 |
| 11 | 011110010 | 7 | 110001110 | 5 | 011110010 | 5 | 110001110 | 3 | 011110010 | 3 | 110001110 | 1 | 000001111 | 3 |
| 12 | 100111100 | 6 | 011011001 | 5 | 100111100 | 4 | 011011001 | 3 | 100111100 | 2 | 011011001 | 1 | 100000100 | 6 |
| 13 | 100111100 | 7 | 100111100 | 5 | 100111100 | 5 | 101100011 | 3 | 100111100 | 3 | 101100011 | 1 | 100000100 | 7 |
| 14 | 101011100 | 6 | 101010011 | 5 | 101011100 | 4 | 101010011 | 3 | 101011100 | 2 | 101010011 | 1 | 100001000 | 6 |
| 15 | 101011100 | 7 | 101001110 | 5 | 101011100 | 5 | 101001110 | 3 | 101011100 | 3 | 101001110 | 1 | 100001000 | 7 |
| 16 | 101101100 | 6 | 101001011 | 5 | 101101100 | 4 | 101001011 | 3 | 101101100 | 3 | 101001011 | 1 | 100010000 | 6 |
| 17 | 101101100 | 7 | 011010101 | 5 | 101101100 | 5 | 011010101 | 3 | 101101100 | 3 | 011010101 | 1 | 100010000 | 7 |
| 18 | 101110001 | 6 | 100111011 | 5 | 101110001 | 4 | 100111010 | 3 | 101110001 | 2 | 100111010 | 1 | 100100000 | 6 |
| 19 | 101110001 | 7 | 100110011 | 5 | 101110001 | 5 | 100110011 | 3 | 101110001 | 3 | 100110011 | 1 | 100100000 | 7 |
| 20 | 101110100 | 6 | 100110011 | 5 | 101110100 | 4 | 100110011 | 3 | 101110100 | 2 | 100110011 | 1 | 000001011 | 4 |
| 21 | 101110100 | 7 | 100101110 | 5 | 101110100 | 5 | 100101110 | 3 | 101110100 | 3 | 100101110 | 1 | 000001011 | 5 |

| Ww | Y1 | Sx | Y2 | Sx | Y3 | Sx | Y4 | Sx | Y5 | Sx | Y6 | Sx | Y7 | Sx |
|---|---|---|---|---|---|---|---|---|---|---|---|---|---|---|
| 22 | 101111000 | 6 | 100101011 | 5 | 101111000 | 4 | 100101011 | 3 | 101111000 | 2 | 100101011 | 1 | 000001110 | 4 |
| 23 | 101111000 | 7 | 011001101 | 5 | 101111000 | 5 | 011001101 | 3 | 101111000 | 3 | 011001101 | 1 | 000001110 | 5 |
| 24 | 111110101 | 2 | 010111001 | 5 | 001111011 | 2 | 010111001 | 3 | 000010011 | 6 | 010111001 | 1 | 000010011 | 4 |
| 25 | 111110101 | 3 | 010110101 | 5 | 001111011 | 3 | 010110101 | 3 | 000010011 | 7 | 010110101 | 1 | 000010011 | 5 |
| 26 | 110101100 | 6 | 010101011 | 5 | 110101100 | 4 | 010101011 | 3 | 110101100 | 2 | 010101011 | 1 | 000100011 | 4 |
| 27 | 110101100 | 7 | 011101001 | 5 | 110101100 | 5 | 011101001 | 3 | 110101100 | 3 | 011101001 | 1 | 000100011 | 5 |
| 28 | 110110001 | 6 | 011100101 | 5 | 110110001 | 4 | 011100101 | 3 | 110110001 | 2 | 011100101 | 1 | 001100011 | 4 |
| 29 | 110110001 | 7 | 110000111 | 5 | 110110001 | 5 | 110000111 | 3 | 110110001 | 3 | 110000111 | 1 | 001100011 | 5 |
| 30 | 110110100 | 6 | 001111101 | 3 | 110110100 | 4 | 101000111 | 5 | 110110100 | 2 | 101000111 | 1 | 010000011 | 4 |
| 31 | 110110100 | 7 | 100100111 | 5 | 110110100 | 5 | 100100111 | 4 | 110110100 | 3 | 100100111 | 1 | 010000011 | 5 |
| 32 | 110111000 | 6 | 110100010 | 6 | 110111000 | 4 | 110100010 | 4 | 000100110 | 6 | 110100010 | 2 | 000100110 | 4 |
| 33 | 110111000 | 7 | 110010010 | 7 | 110111000 | 5 | 110010010 | 5 | 001100110 | 7 | 110010010 | 3 | 000100110 | 5 |
| 34 | 111000101 | 6 | 110010010 | 6 | 111000101 | 4 | 110010010 | 4 | 111001101 | 2 | 110010010 | 3 | 000011010 | 4 |
| 35 | 111000101 | 7 | 110010010 | 7 | 111000101 | 5 | 110010010 | 5 | 111001101 | 3 | 110010010 | 3 | 000011010 | 5 |
| 36 | 111001001 | 6 | 110001010 | 6 | 111001001 | 4 | 110001010 | 4 | 111001001 | 2 | 110001010 | 2 | 001100110 | 4 |
| 37 | 111001001 | 7 | 110001010 | 7 | 111001001 | 5 | 110001010 | 5 | 111001001 | 3 | 110001010 | 3 | 001100110 | 5 |
| 38 | 111001100 | 6 | 011010100 | 6 | 111001100 | 4 | 110001010 | 5 | 111001100 | 2 | 011010100 | 2 | 000010110 | 4 |
| 39 | 111001100 | 7 | 011010100 | 7 | 111001100 | 5 | 011010100 | 4 | 111001100 | 3 | 011010100 | 3 | 000010110 | 5 |
| 40 | 111010001 | 6 | 010011000 | 6 | 111010001 | 4 | 010111000 | 4 | 111010001 | 2 | 010110100 | 4 | 010000110 | 4 |
| 41 | 111010001 | 7 | 010111000 | 7 | 111010001 | 5 | 010111000 | 5 | 111010001 | 3 | 010110000 | 5 | 010000110 | 5 |
| 42 | 111010100 | 6 | 101100010 | 6 | 111010100 | 4 | 101100010 | 4 | 111010100 | 2 | 101100010 | 2 | 100000101 | 4 |

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 43 | 111010100 | 7 | 101100010 | 7 | 111010100 | 5 | 101100010 | 5 | 111010100 | 3 | 101100010 | 3 | 100000101 | 5 |
| 44 | 111011000 | 6 | 101010010 | 6 | 111011000 | 4 | 101010010 | 4 | 100001001 | 6 | 101010010 | 2 | 100001001 | 4 |
| 45 | 111011000 | 7 | 101010010 | 7 | 111011000 | 5 | 101010010 | 5 | 100010001 | 7 | 101010010 | 3 | 100001001 | 5 |
| 46 | 111100001 | 6 | 101001010 | 6 | 111100001 | 4 | 101001010 | 4 | 100010001 | 6 | 101001010 | 2 | 100010001 | 4 |
| 47 | 111100001 | 7 | 101001010 | 7 | 111100001 | 5 | 101001010 | 5 | 100010001 | 7 | 101001010 | 3 | 100010001 | 5 |
| 48 | 111100100 | 6 | 011001100 | 6 | 111100100 | 4 | 011001100 | 4 | 100100001 | 6 | 011001100 | 2 | 100100001 | 4 |
| 49 | 111100100 | 7 | 011001100 | 7 | 111100100 | 5 | 011001100 | 5 | 100100001 | 7 | 011001100 | 3 | 100100001 | 5 |
| 50 | 111101000 | 6 | 010110100 | 6 | 111101000 | 4 | 010110100 | 4 | 101000001 | 6 | 010110100 | 2 | 101000001 | 4 |
| 51 | 111101000 | 7 | 010110100 | 7 | 111101000 | 5 | 010110100 | 5 | 101000001 | 7 | 010110100 | 3 | 101000001 | 5 |
| 52 | 110011100 | 6 | 100110010 | 6 | 110011100 | 4 | 100110010 | 4 | 110011100 | 2 | 100110010 | 2 | 110000001 | 4 |
| 53 | 110011100 | 7 | 100101010 | 7 | 110011100 | 5 | 100110010 | 5 | 110011100 | 3 | 100110010 | 3 | 110000001 | 5 |
| 54 | 110011001 | 6 | 100101010 | 6 | 110011001 | 4 | 100101010 | 4 | 110011001 | 2 | 100101010 | 2 | 010010010 | 4 |
| 55 | 110011001 | 7 | 100101010 | 7 | 110011001 | 5 | 100101010 | 5 | 110011001 | 3 | 100101010 | 3 | 010010010 | 5 |
| 56 | 110101001 | 6 | 011101000 | 6 | 110101001 | 4 | 011101000 | 4 | 110101001 | 2 | 011101000 | 2 | 010100010 | 4 |
| 57 | 110101001 | 7 | 011101000 | 7 | 110101001 | 5 | 011101000 | 5 | 110101001 | 3 | 011101000 | 3 | 010100010 | 5 |
| 58 | 111110001 | 4 | 011100100 | 6 | 010111110 | 2 | 011100100 | 4 | 011000010 | 6 | 011100100 | 2 | 011000010 | 4 |
| 59 | 111110001 | 5 | 011100100 | 7 | 010111110 | 3 | 011100100 | 5 | 011000010 | 7 | 011100100 | 3 | 011000010 | 5 |
| 60 | 011010111 | 4 | 010101100 | 6 | 011101011 | 2 | 010101100 | 4 | 001001010 | 6 | 010101100 | 2 | 001001010 | 4 |
| 61 | 011010111 | 5 | 010101100 | 7 | 011010111 | 3 | 010101100 | 5 | 001001010 | 7 | 010101100 | 3 | 001001010 | 5 |
| 62 | 011011011 | 4 | 011011000 | 6 | 011011011 | 2 | 011011000 | 4 | 001010010 | 6 | 011011000 | 2 | 001010010 | 4 |
| 63 | 011011011 | 5 | 011011000 | 7 | 011011011 | 3 | 011011000 | 5 | 001010010 | 7 | 011011000 | 3 | 001010010 | 5 |

FIG.2a-3

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 64 | 01011110 | 4 | 11000110 | 6 | 01101110 | 2 | 11000110 | 4 | 10001100 | 6 | 11000110 | 2 | 10001100 | 4 |
| 65 | 01101110 | 5 | 11000110 | 7 | 01101110 | 3 | 11000110 | 5 | 10001100 | 7 | 11000110 | 3 | 10001100 | 5 |
| 66 | 01100111 | 4 | 00110100 | 6 | 01110011 | 2 | 00110100 | 4 | 00110010 | 6 | 00110100 | 2 | 00110010 | 4 |
| 67 | 01100111 | 5 | 00110100 | 7 | 01110011 | 3 | 00110100 | 5 | 00110010 | 7 | 00110100 | 3 | 00110010 | 5 |
| 68 | 01101011 | 4 | 10100110 | 6 | 01101011 | 2 | 10100110 | 4 | 10010100 | 6 | 10100110 | 2 | 10010100 | 4 |
| 69 | 01101011 | 5 | 10100110 | 7 | 01101011 | 3 | 10100110 | 5 | 10010100 | 7 | 10100110 | 3 | 10010100 | 5 |
| 70 | 01101110 | 4 | 00110001 | 6 | 01101110 | 2 | 00110001 | 4 | 10011000 | 6 | 00110001 | 2 | 10011000 | 4 |
| 71 | 01101110 | 5 | 00110001 | 7 | 01101110 | 3 | 00110001 | 5 | 10011000 | 7 | 00110001 | 3 | 10011000 | 5 |
| 72 | 01100011 | 4 | 10010110 | 6 | 01100011 | 2 | 10010110 | 4 | 00010100 | 6 | 00110110 | 2 | 00010100 | 4 |
| 73 | 01100011 | 5 | 10010110 | 7 | 01100011 | 3 | 10010110 | 5 | 00010100 | 7 | 00110110 | 3 | 00010100 | 5 |
| 74 | 01101010 | 4 | 00110110 | 6 | 01110110 | 2 | 00110110 | 4 | 10010010 | 6 | 00110110 | 2 | 10010010 | 4 |
| 75 | 01101010 | 5 | 00110100 | 7 | 01111010 | 3 | 00110100 | 5 | 10010010 | 7 | 00110100 | 3 | 10010100 | 5 |
| 76 | 01111010 | 4 | 10001110 | 6 | 01111010 | 2 | 10001110 | 4 | 10010000 | 6 | 10001110 | 2 | 10010000 | 4 |
| 77 | 01111010 | 5 | 10001110 | 7 | 01111010 | 3 | 10001110 | 5 | 10010000 | 7 | 10001110 | 3 | 10010000 | 5 |
| 78 | 10011101 | 4 | 10001010 | 6 | 10011101 | 2 | 10001010 | 4 | 00010010 | 6 | 10001010 | 2 | 00010010 | 4 |
| 79 | 10011101 | 5 | 10001010 | 7 | 10011101 | 3 | 10001010 | 5 | 00010010 | 7 | 10001010 | 3 | 00010010 | 5 |
| 80 | 10101101 | 4 | 01101001 | 6 | 10101101 | 2 | 01101001 | 4 | 10100100 | 6 | 01101100 | 2 | 10100100 | 4 |
| 81 | 10101101 | 5 | 01101001 | 7 | 10101101 | 3 | 01101001 | 5 | 10100100 | 7 | 01101100 | 3 | 10100100 | 5 |
| 82 | 10110101 | 4 | 00110101 | 6 | 10110101 | 2 | 00110101 | 4 | 10100100 | 6 | 01100101 | 2 | 10100100 | 4 |
| 83 | 10110101 | 5 | 00110101 | 7 | 10110101 | 3 | 00110101 | 5 | 10100100 | 7 | 01100101 | 3 | 10100100 | 5 |
| 84 | 10111001 | 4 | 00110101 | 6 | 10110101 | 2 | 00110101 | 4 | 01001010 | 6 | 01100101 | 2 | 01001010 | 4 |
| 85 | 10111001 | 5 | 00110101 | 7 | 10110101 | 3 | 00110101 | 5 | 01001010 | 7 | 01100101 | 3 | 01001010 | 5 |

FIG. 2b-1

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 86 | 101111001 | 4 | 001011001 | 6 | 101111001 | 2 | 001011001 | 4 | 110000100 | 6 | 001011001 | 2 | 110000100 | 4 |
| 87 | 101111001 | 5 | 001011001 | 7 | 101111001 | 3 | 001011001 | 5 | 110000100 | 7 | 001011001 | 3 | 110000100 | 5 |
| 88 | 101111100 | 4 | 011000001 | 6 | 101111100 | 2 | 011100001 | 4 | 110001000 | 6 | 011100001 | 2 | 110001000 | 4 |
| 89 | 101111100 | 5 | 011100001 | 7 | 101111100 | 3 | 011100001 | 5 | 110001000 | 7 | 011100001 | 3 | 110001000 | 5 |
| 90 | 110011101 | 4 | 011010001 | 6 | 110011101 | 2 | 011010001 | 4 | 000010111 | 4 | 011010001 | 2 | 000010111 | 2 |
| 91 | 110011101 | 5 | 011010001 | 7 | 110011101 | 3 | 011010001 | 5 | 000010111 | 5 | 011010001 | 3 | 000010111 | 3 |
| 92 | 110101101 | 4 | 011001001 | 6 | 110101101 | 2 | 011001001 | 4 | 000011011 | 4 | 011001001 | 2 | 000011011 | 2 |
| 93 | 110101101 | 5 | 011001001 | 7 | 110101101 | 3 | 011001001 | 5 | 000011011 | 5 | 011001001 | 3 | 000011011 | 3 |
| 94 | 110110101 | 4 | 011000101 | 6 | 110110101 | 2 | 011000101 | 4 | 000011101 | 4 | 011000101 | 2 | 000011101 | 2 |
| 95 | 110110101 | 5 | 011000101 | 7 | 110110101 | 3 | 011000101 | 5 | 000011101 | 5 | 011000101 | 3 | 000011101 | 3 |
| 96 | 110111001 | 4 | 010110001 | 6 | 110111001 | 2 | 010110001 | 4 | 000100111 | 4 | 010110001 | 2 | 000100111 | 2 |
| 97 | 110111001 | 5 | 010110001 | 7 | 110111001 | 3 | 010110001 | 5 | 000100111 | 5 | 010110001 | 3 | 000100111 | 3 |
| 98 | 110111100 | 4 | 010101001 | 6 | 110111100 | 2 | 010101001 | 4 | 001001011 | 4 | 010101001 | 2 | 001001011 | 2 |
| 99 | 110111100 | 5 | 010101001 | 7 | 110111100 | 3 | 010101001 | 5 | 001001011 | 5 | 010101001 | 3 | 001001011 | 3 |
| 100 | 111001101 | 4 | 010100101 | 6 | 111001101 | 2 | 010100101 | 4 | 010000111 | 4 | 010100101 | 2 | 010000111 | 2 |
| 101 | 111001101 | 5 | 010100101 | 7 | 111001101 | 3 | 010100101 | 5 | 010000111 | 5 | 010100101 | 3 | 010000111 | 3 |
| 102 | 111010101 | 4 | 010011100 | 6 | 111010101 | 2 | 010011100 | 4 | 000110011 | 4 | 010011100 | 2 | 000110011 | 2 |
| 103 | 111010101 | 5 | 010011100 | 7 | 111010101 | 3 | 010011100 | 5 | 000110011 | 5 | 010011100 | 3 | 000110011 | 3 |
| 104 | 111011001 | 4 | 010011001 | 6 | 111011001 | 2 | 010011001 | 4 | 000110110 | 4 | 010011001 | 2 | 000110110 | 2 |
| 105 | 111011001 | 5 | 010011001 | 7 | 111011001 | 3 | 010011001 | 5 | 000110110 | 5 | 010011001 | 3 | 000110110 | 3 |
| 106 | 111011100 | 4 | 010010101 | 6 | 111011100 | 2 | 010010101 | 4 | 000111010 | 4 | 010010101 | 2 | 000111010 | 2 |
| 107 | 111011100 | 5 | 010010101 | 7 | 111011100 | 3 | 010010101 | 5 | 000111010 | 5 | 010010101 | 3 | 000111010 | 3 |

FIG. 2b-2

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 108 | 111100101 | 4 | 001010101 | 6 | 111100101 | 2 | 001010101 | 4 | 000101011 | 4 | 001010101 | 2 | 000101011 | 2 |
| 109 | 111100101 | 5 | 001010101 | 7 | 111100101 | 3 | 001010101 | 5 | 000101011 | 5 | 001010101 | 3 | 000101011 | 3 |
| 110 | 111101001 | 4 | 001111000 | 6 | 111101001 | 2 | 001111000 | 4 | 001001011 | 4 | 001111000 | 2 | 001001011 | 2 |
| 111 | 111101001 | 5 | 001111000 | 7 | 111101001 | 3 | 001111000 | 5 | 001001011 | 5 | 001111000 | 3 | 001001011 | 3 |
| 112 | 111101100 | 4 | 110000011 | 6 | 111101100 | 2 | 110000011 | 4 | 001001110 | 4 | 110000011 | 2 | 001001110 | 2 |
| 113 | 111101100 | 5 | 110000011 | 7 | 111101100 | 3 | 110000011 | 5 | 001001110 | 5 | 110000011 | 3 | 001001110 | 3 |
| 114 | 011110111 | 2 | 101000011 | 6 | 001010011 | 6 | 101000011 | 4 | 001010011 | 4 | 101000011 | 2 | 001010011 | 2 |
| 115 | 011110111 | 3 | 101000011 | 7 | 001010011 | 7 | 101000011 | 5 | 001010011 | 5 | 101000011 | 3 | 001010011 | 3 |
| 116 | 011111011 | 2 | 100100011 | 6 | 011001111 | 2 | 100100011 | 4 | 001100011 | 4 | 100100011 | 2 | 001100011 | 2 |
| 117 | 011111011 | 3 | 100100011 | 7 | 011001111 | 3 | 100100011 | 5 | 001100011 | 5 | 100100011 | 3 | 001100011 | 3 |
| 118 | 110111011 | 2 | 100010011 | 6 | 000010111 | 6 | 100010011 | 4 | 000101011 | 4 | 100010011 | 2 | 000101011 | 2 |
| 119 | 110111011 | 3 | 100010011 | 7 | 000010111 | 7 | 100010011 | 5 | 000101011 | 5 | 100010011 | 3 | 000101011 | 3 |
| 120 | 101111101 | 2 | 100001011 | 6 | 000001011 | 6 | 100001011 | 4 | 010001011 | 4 | 100001110 | 2 | 010001011 | 2 |
| 121 | 101111101 | 3 | 100001011 | 7 | 000001011 | 7 | 100001011 | 5 | 010001011 | 5 | 100001110 | 3 | 010001011 | 3 |
| 122 | 110111101 | 2 | 100001101 | 6 | 010001011 | 6 | 100001011 | 4 | 010001011 | 4 | 100001110 | 2 | 010001011 | 2 |
| 123 | 110111101 | 3 | 100001101 | 7 | 010001011 | 7 | 100001011 | 5 | 010001011 | 5 | 100001110 | 3 | 010001011 | 3 |
| 124 | 111011101 | 2 | 000101101 | 6 | 010010011 | 6 | 000101101 | 4 | 010010011 | 4 | 000101101 | 2 | 010010011 | 2 |
| 125 | 111011101 | 3 | 000101101 | 7 | 010010011 | 7 | 000101101 | 5 | 010010011 | 5 | 000101101 | 3 | 010010011 | 3 |
| 126 | 111101101 | 2 | 010001101 | 6 | 001110111 | 2 | 010001101 | 4 | 010100011 | 4 | 010001101 | 2 | 010100011 | 2 |
| 127 | 111101101 | 3 | 010001101 | 7 | 001110111 | 3 | 010001101 | 5 | 010100011 | 5 | 010001101 | 3 | 010100011 | 3 |

FIG.2b-3

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 128 | 101111110 | 2 | 001001101 | 6 | 011000011 | 6 | 001001101 | 4 | 011000011 | 4 | 001001101 | 2 | 011000011 | 2 |
| 129 | 101111110 | 3 | 001001101 | 7 | 011000011 | 7 | 001001101 | 5 | 011000011 | 5 | 001001101 | 3 | 011000011 | 3 |
| 130 | 101111011 | 2 | 000111100 | 6 | 100001101 | 6 | 000111100 | 4 | 100001101 | 4 | 000111100 | 2 | 100001101 | 2 |
| 131 | 101111011 | 3 | 000111100 | 7 | 100001101 | 7 | 000111100 | 5 | 100001101 | 5 | 000111100 | 3 | 100001101 | 3 |
| 132 | 101110111 | 2 | 000111001 | 6 | 001100110 | 6 | 000111001 | 4 | 001100110 | 4 | 000111001 | 2 | 001100110 | 2 |
| 133 | 101110111 | 3 | 000111001 | 7 | 001100110 | 7 | 000111001 | 5 | 001100110 | 5 | 000111001 | 3 | 001100110 | 3 |
| 134 | 011111101 | 2 | 000110101 | 6 | 001101010 | 6 | 000110101 | 4 | 001101010 | 4 | 000110101 | 2 | 001101010 | 2 |
| 135 | 011111101 | 3 | 000110101 | 7 | 001101010 | 7 | 000110101 | 5 | 001101010 | 5 | 000110101 | 3 | 001101010 | 3 |
| 136 | 111101010 | 4 | 111101010 | 2 | 010101010 | 2 | 100000111 | 4 | 010010110 | 4 | 100000111 | 2 | 010010110 | 2 |
| 137 | 111101010 | 5 | 111101010 | 3 | 010101010 | 3 | 100000111 | 5 | 010010110 | 5 | 100000111 | 3 | 010010110 | 3 |
| 138 | 111100110 | 4 | 111100110 | 2 | 010100110 | 2 | 000011101 | 4 | 010011010 | 4 | 000011101 | 2 | 010011010 | 2 |
| 139 | 111100110 | 5 | 111100110 | 3 | 010100110 | 3 | 000011101 | 5 | 010011010 | 5 | 000011101 | 3 | 010011010 | 3 |
| 140 | 111100011 | 4 | 111100011 | 2 | 001110010 | 2 | 110000010 | 6 | 001110010 | 4 | 110000010 | 4 | 001110010 | 2 |
| 141 | 111100011 | 5 | 111100011 | 3 | 001110010 | 3 | 110000010 | 7 | 001110010 | 5 | 110000010 | 5 | 001110010 | 3 |
| 142 | 111011010 | 4 | 111011010 | 2 | 010100110 | 2 | 101000010 | 6 | 010100110 | 4 | 101000010 | 4 | 010100110 | 2 |
| 143 | 111011010 | 5 | 111011010 | 3 | 010100110 | 3 | 101000010 | 7 | 010100110 | 5 | 101000010 | 5 | 010100110 | 3 |
| 144 | 111010110 | 4 | 111010110 | 2 | 001011010 | 2 | 100100010 | 6 | 001011010 | 4 | 100100010 | 4 | 001011010 | 2 |
| 145 | 111010110 | 5 | 111010110 | 3 | 001011010 | 3 | 100100010 | 7 | 001011010 | 5 | 100100010 | 5 | 001011010 | 3 |
| 146 | 111010011 | 4 | 111010011 | 2 | 011000110 | 2 | 100010010 | 6 | 011000110 | 4 | 100010010 | 4 | 011000110 | 2 |
| 147 | 111010011 | 5 | 111010011 | 3 | 011000110 | 3 | 100010010 | 7 | 011000110 | 5 | 100010010 | 5 | 011000110 | 3 |

FIG. 2c-1

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 148 | 111001110 | 4 | 111001110 | 2 | 001010110 | 6 | 100001010 | 6 | 001010110 | 4 | 100001010 | 4 | 001010110 | 2 |
| 149 | 111001110 | 5 | 111001110 | 3 | 001010101 | 7 | 100001010 | 7 | 001010110 | 5 | 100001010 | 5 | 001010110 | 3 |
| 150 | 111001011 | 4 | 111001011 | 2 | 100010101 | 6 | 001100100 | 6 | 100010101 | 4 | 001100100 | 4 | 100010101 | 2 |
| 151 | 111001011 | 5 | 111001011 | 3 | 100010101 | 7 | 001100100 | 7 | 100010101 | 5 | 001100100 | 5 | 100010101 | 3 |
| 152 | 111011011 | 2 | 111001011 | 2 | 100011001 | 6 | 000101100 | 6 | 100011001 | 4 | 000101100 | 4 | 100011001 | 2 |
| 153 | 111011011 | 3 | 111000111 | 3 | 100011001 | 7 | 000101100 | 7 | 100011001 | 5 | 000101100 | 5 | 100011001 | 3 |
| 154 | 110111010 | 4 | 110111010 | 2 | 100011100 | 6 | 011001000 | 6 | 100011100 | 4 | 011001000 | 4 | 100011100 | 2 |
| 155 | 110111010 | 5 | 110111010 | 3 | 100011100 | 7 | 011001000 | 7 | 100011100 | 5 | 011001000 | 5 | 100011100 | 3 |
| 156 | 110110110 | 4 | 110110110 | 2 | 100100101 | 6 | 011000100 | 6 | 100100101 | 4 | 011000100 | 4 | 100100101 | 2 |
| 157 | 110110110 | 5 | 110110110 | 3 | 100100101 | 7 | 011000100 | 7 | 100100101 | 5 | 011000100 | 5 | 100100101 | 3 |
| 158 | 110110011 | 4 | 110110011 | 2 | 100101001 | 6 | 001011000 | 6 | 100101001 | 4 | 001011000 | 4 | 100101001 | 2 |
| 159 | 110110011 | 5 | 110110011 | 3 | 100101001 | 7 | 001011000 | 7 | 100101001 | 5 | 001011000 | 5 | 100101001 | 3 |
| 160 | 110101101 | 4 | 110101101 | 2 | 100110001 | 6 | 010101000 | 6 | 100110001 | 4 | 010101000 | 4 | 100110001 | 2 |
| 161 | 110101101 | 5 | 110101101 | 3 | 100110001 | 7 | 010101000 | 7 | 100110001 | 5 | 010101000 | 5 | 100110001 | 3 |
| 162 | 110101011 | 4 | 110101011 | 2 | 101000101 | 6 | 010100100 | 6 | 101000101 | 4 | 010100100 | 4 | 101000101 | 2 |
| 163 | 110101011 | 5 | 110101011 | 3 | 101000101 | 7 | 010100100 | 7 | 101000101 | 5 | 010100100 | 5 | 101000101 | 3 |
| 164 | 110100111 | 4 | 110100111 | 2 | 101001001 | 6 | 010010100 | 6 | 101001001 | 4 | 010010100 | 4 | 101001001 | 2 |
| 165 | 110100111 | 5 | 110100111 | 3 | 101001001 | 7 | 001010100 | 7 | 101001001 | 5 | 001010100 | 5 | 101001001 | 3 |
| 166 | 110011110 | 4 | 110011110 | 2 | 101010001 | 6 | 010011000 | 6 | 101010001 | 4 | 010011000 | 4 | 101010001 | 2 |
| 167 | 110011101 | 5 | 110011110 | 3 | 101010001 | 7 | 010010100 | 7 | 101010001 | 5 | 010010100 | 5 | 101010001 | 3 |
| 168 | 110011011 | 4 | 110011011 | 2 | 101100001 | 6 | 010010100 | 6 | 101100001 | 4 | 010010100 | 4 | 101100001 | 2 |
| 169 | 110011011 | 5 | 110011011 | 3 | 101100001 | 7 | 010100100 | 7 | 101100001 | 5 | 010010100 | 5 | 101100001 | 3 |
| 170 | 110010111 | 4 | 110010111 | 2 | 110000101 | 6 | 000111000 | 6 | 110000101 | 4 | 000111000 | 4 | 110000101 | 2 |

FIG. 2c-2

| Ww | Y1 | Sx | Y2 | Sx | Y3 | Sx | Y4 | Sx | Y5 | Sx | Y6 | Sx | Y7 | Sx |
|---|---|---|---|---|---|---|---|---|---|---|---|---|---|---|
| 171 | 110010111 | 5 | 110010111 | 3 | 110000101 | 7 | 000111000 | 7 | 110000101 | 5 | 000011000 | 5 | 110000101 | 3 |
| 172 | 101111010 | 4 | 101111010 | 2 | 110001001 | 6 | 010001100 | 6 | 110001001 | 4 | 010001100 | 4 | 110001001 | 2 |
| 173 | 101111010 | 5 | 101111010 | 3 | 110001001 | 7 | 010001100 | 7 | 110001001 | 5 | 010001100 | 5 | 110001001 | 3 |
| 174 | 101110110 | 4 | 101110110 | 2 | 110010001 | 6 | 001001100 | 6 | 110010001 | 4 | 001001100 | 4 | 110010001 | 2 |
| 175 | 101110110 | 5 | 101110110 | 3 | 110010001 | 7 | 001001100 | 7 | 110010001 | 5 | 001001100 | 5 | 110010001 | 3 |
| 176 | 101100011 | 4 | 101100011 | 2 | 110100001 | 6 | 000110100 | 6 | 110100001 | 4 | 000110100 | 4 | 110100001 | 2 |
| 177 | 101100111 | 5 | 101100111 | 3 | 110100001 | 7 | 000110100 | 7 | 110100001 | 5 | 000110100 | 5 | 110100001 | 3 |
| 178 | 101101110 | 4 | 101101110 | 2 | 011001010 | 6 | 001101010 | 6 | 011001010 | 4 | 001101010 | 4 | 011001010 | 2 |
| 179 | 101101110 | 5 | 101101110 | 3 | 011001010 | 7 | 001101010 | 7 | 011001010 | 5 | 001101010 | 5 | 011001010 | 3 |
| 180 | 101101011 | 4 | 101101011 | 2 | 011010010 | 6 | 100000110 | 6 | 011010010 | 4 | 100000110 | 4 | 011010010 | 2 |
| 181 | 101101011 | 5 | 101101011 | 3 | 011010010 | 7 | 100000110 | 7 | 011010010 | 5 | 100000110 | 5 | 011010010 | 3 |
| 182 | 101100111 | 4 | 101100111 | 2 | 101001100 | 6 | 000010101 | 6 | 101001100 | 4 | 000010101 | 4 | 101001100 | 2 |
| 183 | 101100111 | 5 | 101100111 | 3 | 101001100 | 7 | 000010101 | 7 | 101001100 | 5 | 000010101 | 5 | 101001100 | 3 |
| 184 | 101101011 | 4 | 101101011 | 2 | 011100010 | 6 | 011000001 | 6 | 011100010 | 4 | 011000001 | 4 | 011100010 | 2 |
| 185 | 101101110 | 5 | 101101110 | 3 | 011100010 | 7 | 011000001 | 7 | 011100010 | 5 | 011000001 | 5 | 011100010 | 3 |
| 186 | 101011011 | 4 | 101011011 | 2 | 101010100 | 6 | 010100001 | 6 | 101010100 | 4 | 010100001 | 4 | 101010100 | 2 |
| 187 | 101010111 | 5 | 101010111 | 3 | 101010100 | 7 | 010100001 | 7 | 101010100 | 5 | 010100001 | 5 | 101010100 | 3 |
| 188 | 101010111 | 4 | 101010111 | 2 | 101011000 | 6 | 010010001 | 6 | 101011000 | 4 | 010010001 | 4 | 101011000 | 2 |
| 189 | 101010111 | 5 | 101010111 | 3 | 101011000 | 7 | 010010001 | 7 | 101011000 | 5 | 010010001 | 5 | 101011000 | 3 |
| 190 | 100111110 | 4 | 100111110 | 2 | 010101010 | 6 | 010001001 | 6 | 010101010 | 4 | 010001001 | 4 | 010101010 | 2 |
| 191 | 100111110 | 5 | 100111110 | 3 | 010101010 | 7 | 010001001 | 7 | 010101010 | 5 | 010001001 | 5 | 010101010 | 3 |

FIG.2c-3

| Ww | Y1 | Sx | Y2 | Sx | Y3 | Sx | Y4 | Sx | Y5 | Sx | Y6 | Sx | Y7 | Sx |
|---|---|---|---|---|---|---|---|---|---|---|---|---|---|---|
| 192 | 100111011 | 4 | 100111011 | 2 | 101100100 | 6 | 010000101 | 6 | 101100100 | 4 | 010000101 | 4 | 101100100 | 2 |
| 193 | 100111011 | 5 | 100111011 | 3 | 101100100 | 7 | 010000101 | 7 | 101100100 | 5 | 010000101 | 5 | 101100100 | 3 |
| 194 | 100110111 | 4 | 100110111 | 2 | 101101000 | 6 | 001100001 | 6 | 101101000 | 4 | 001100001 | 4 | 101101000 | 2 |
| 195 | 100110111 | 5 | 100110111 | 3 | 101101000 | 7 | 001100001 | 7 | 101101000 | 5 | 001100001 | 5 | 101101000 | 3 |
| 196 | 011111100 | 4 | 011111100 | 2 | 100101100 | 6 | 001010001 | 6 | 100101100 | 4 | 001010001 | 4 | 100101100 | 2 |
| 197 | 011111100 | 5 | 011111100 | 3 | 100101100 | 7 | 001010001 | 7 | 100101100 | 5 | 001010001 | 5 | 100101100 | 3 |
| 198 | 011111001 | 4 | 011111001 | 2 | 010110010 | 6 | 001001001 | 6 | 010110010 | 4 | 001001001 | 4 | 010110010 | 2 |
| 199 | 011111001 | 5 | 011111001 | 3 | 010110010 | 7 | 001001001 | 7 | 010110010 | 5 | 001001001 | 5 | 010110010 | 3 |
| 200 | 011110101 | 4 | 011110101 | 2 | 110001100 | 6 | 001000101 | 6 | 110001100 | 4 | 001000101 | 4 | 110001100 | 2 |
| 201 | 011110101 | 5 | 011110101 | 3 | 110001100 | 7 | 001000101 | 7 | 110001100 | 5 | 001000101 | 5 | 110001100 | 3 |
| 202 | 011101101 | 4 | 011101101 | 2 | 100110100 | 6 | 000110100 | 6 | 100110100 | 4 | 000110001 | 4 | 100110100 | 2 |
| 203 | 011101101 | 5 | 011101101 | 3 | 100110100 | 7 | 000110001 | 7 | 100110100 | 5 | 000110001 | 5 | 100110100 | 3 |
| 204 | 011011101 | 4 | 011011101 | 2 | 110010100 | 6 | 000101001 | 6 | 110010100 | 4 | 000101001 | 4 | 110010100 | 2 |
| 205 | 011011101 | 5 | 011011101 | 3 | 110010100 | 7 | 000101001 | 7 | 110010100 | 5 | 000101001 | 5 | 110010100 | 3 |
| 206 | 110100110 | 6 | 110100110 | 4 | 110011000 | 6 | 110100110 | 2 | 110011000 | 4 | 000100101 | 4 | 110011000 | 2 |
| 207 | 110100110 | 7 | 110100110 | 5 | 110011000 | 7 | 110100110 | 3 | 110011000 | 5 | 000100101 | 5 | 110011000 | 3 |
| 208 | 111100010 | 6 | 111100010 | 4 | 100111000 | 6 | 000011100 | 6 | 100111000 | 4 | 000011100 | 4 | 000011111 | 1 |
| 209 | 111100010 | 7 | 111100010 | 5 | 100111000 | 7 | 000011100 | 7 | 100111000 | 5 | 000011100 | 5 | 010001111 | 1 |
| 210 | 111010010 | 6 | 111010010 | 4 | 110100100 | 6 | 111010010 | 2 | 110100100 | 4 | 000011001 | 4 | 101100100 | 2 |
| 211 | 111010010 | 7 | 111010010 | 5 | 110100100 | 7 | 111010010 | 3 | 110100100 | 5 | 000011001 | 5 | 110101000 | 3 |
| 212 | 111001010 | 6 | 111001010 | 4 | 110101000 | 6 | 111001010 | 2 | 110101000 | 4 | 100000011 | 4 | 110101000 | 2 |
| 213 | 111001010 | 7 | 111001010 | 5 | 110101000 | 7 | 111001010 | 3 | 110101000 | 5 | 100000011 | 5 | 110101000 | 3 |

FIG.2d-1

| Ww | V1 | Sx | V2 | Sx | V3 | Sx | V4 | Sx | V5 | Sx | V6 | Sx | V7 | Sx |
|---|---|---|---|---|---|---|---|---|---|---|---|---|---|---|
| 214 | 111000110 | 6 | 111000110 | 4 | 000111110 | 5 | 111000110 | 2 | 000111110 | 3 | 000001101 | 4 | 000111110 | 1 |
| 215 | 111000110 | 7 | 111000110 | 5 | 001010111 | 5 | 111000110 | 3 | 001010111 | 3 | 000001101 | 5 | 001010111 | 1 |
| 216 | 110110010 | 6 | 110110010 | 4 | 001011011 | 5 | 110110010 | 2 | 001011011 | 3 | 100000010 | 6 | 001011011 | 1 |
| 217 | 110110010 | 7 | 110110010 | 5 | 001011110 | 5 | 110110010 | 3 | 001011110 | 3 | 100000010 | 7 | 001011110 | 1 |
| 218 | 101110010 | 6 | 101110010 | 4 | 001100111 | 5 | 101110010 | 2 | 001100111 | 3 | 010100000 | 6 | 001100111 | 1 |
| 219 | 101110010 | 7 | 101110010 | 5 | 001101011 | 5 | 101110010 | 3 | 001101011 | 3 | 010100000 | 7 | 001101011 | 1 |
| 220 | 111000011 | 6 | 111000011 | 4 | 001101110 | 5 | 111000011 | 2 | 001101110 | 3 | 010010000 | 6 | 001101110 | 1 |
| 221 | 111000011 | 7 | 111000011 | 5 | 001110011 | 5 | 111000011 | 3 | 001110011 | 3 | 010010000 | 7 | 001110011 | 1 |
| 222 | 011111000 | 6 | 011111000 | 4 | 001110110 | 5 | 011111000 | 2 | 001110110 | 3 | 010001000 | 6 | 001110110 | 1 |
| 223 | 011111000 | 7 | 011111000 | 5 | 001111010 | 5 | 011111000 | 3 | 001111010 | 3 | 010001000 | 7 | 001111010 | 1 |
| 224 | 011110100 | 6 | 011110100 | 4 | 010010111 | 5 | 011110100 | 2 | 010010111 | 3 | 010000100 | 6 | 010010111 | 1 |
| 225 | 011110100 | 7 | 011110100 | 5 | 010011011 | 5 | 011110100 | 3 | 010011011 | 3 | 010000100 | 7 | 010011011 | 1 |
| 226 | 011110001 | 6 | 011110001 | 4 | 010011110 | 5 | 011110001 | 2 | 010011110 | 3 | 010000001 | 6 | 010011110 | 1 |
| 227 | 011110001 | 7 | 011110001 | 5 | 010101011 | 4 | 011110001 | 3 | 010101011 | 3 | 010000001 | 7 | 010100111 | 1 |
| 228 | 011101100 | 6 | 011101100 | 4 | 100011101 | 4 | 011101100 | 2 | 100011101 | 2 | 001100000 | 6 | 100110000 | 4 |
| 229 | 011101100 | 7 | 011101100 | 5 | 100011101 | 5 | 011101100 | 3 | 100011101 | 3 | 001100000 | 7 | 100110000 | 5 |
| 230 | 111110010 | 4 | 010101100 | 4 | 010110011 | 5 | 010110011 | 2 | 010110011 | 3 | 001010000 | 6 | 010110011 | 1 |
| 231 | 111110010 | 5 | 010101100 | 5 | 010110110 | 5 | 010110110 | 3 | 010110110 | 3 | 001010000 | 7 | 010110110 | 1 |
| 232 | 111110100 | 4 | 010101100 | 4 | 010101101 | 5 | 010111100 | 2 | 010101101 | 3 | 001001000 | 6 | 010101101 | 1 |
| 233 | 111110100 | 5 | 010101100 | 5 | 010101011 | 5 | 010101100 | 3 | 010101011 | 3 | 001001000 | 7 | 010101011 | 1 |
| 234 | 110110111 | 2 | 100011110 | 4 | 011001011 | 5 | 100011110 | 2 | 011001011 | 3 | 001000100 | 6 | 011001011 | 1 |

FIG. 2d-2

| Ww | Y1 | Sx | Y2 | Sx | Y3 | Sx | Y4 | Sx | Y5 | Sx | Y6 | Sx | Y7 | Sx |
|---|---|---|---|---|---|---|---|---|---|---|---|---|---|---|
| 235 | 110110111 | 3 | 100011110 | 5 | 011001110 | 5 | 100011110 | 3 | 011001110 | 3 | 001000100 | 7 | 011001110 | 1 |
| 236 | 111011110 | 2 | 100011011 | 4 | 011010011 | 5 | 100011011 | 2 | 011010011 | 3 | 001000001 | 6 | 011010011 | 1 |
| 237 | 111011110 | 3 | 100011011 | 5 | 011010110 | 5 | 100011011 | 3 | 011010110 | 3 | 001000001 | 7 | 011010110 | 1 |
| 238 | 111101110 | 2 | 100010111 | 4 | 011011010 | 5 | 100010111 | 2 | 011011010 | 3 | 000010000 | 6 | 011011010 | 1 |
| 239 | 111101110 | 3 | 100010110 | 5 | 011100011 | 5 | 100010110 | 3 | 011100011 | 3 | 000010000 | 7 | 011100011 | 1 |
| 240 | 011100110 | 6 | 010011101 | 4 | 011101010 | 5 | 010011101 | 2 | 011101010 | 3 | 000101000 | 6 | 011100110 | 1 |
| 241 | 011101010 | 7 | 010011101 | 5 | 011101110 | 5 | 010011101 | 3 | 011101110 | 3 | 000101000 | 6 | 011101010 | 1 |
| 242 | 111101011 | 2 | 001111100 | 4 | 010101110 | 5 | 001111100 | 2 | 010101110 | 3 | 000100100 | 6 | 010101110 | 1 |
| 243 | 111110011 | 3 | 001111100 | 5 | 100101101 | 4 | 001111100 | 3 | 100101101 | 3 | 000100100 | 7 | 100101101 | 1 |
| 244 | 100110101 | 6 | 001111001 | 4 | 100110101 | 5 | 001111001 | 2 | 100110101 | 3 | 000100001 | 6 | 100110101 | 1 |
| 245 | 100111001 | 6 | 001111001 | 5 | 100111001 | 5 | 001111001 | 3 | 100111001 | 3 | 000100001 | 7 | 100111001 | 1 |
| 246 | 101101101 | 6 | 001110101 | 4 | 101010101 | 5 | 001110101 | 2 | 101010101 | 3 | 000011000 | 6 | 101011001 | 1 |
| 247 | 110001101 | 6 | 001110101 | 5 | 110001101 | 5 | 001110101 | 3 | 110001101 | 3 | 000011000 | 7 | 110001101 | 1 |
| 248 | 101011001 | 6 | 001101101 | 4 | 101011001 | 5 | 001101101 | 2 | 101011001 | 3 | 000010100 | 6 | 101011001 | 1 |
| 249 | 101011001 | 6 | 001101101 | 5 | 101100101 | 5 | 001101101 | 3 | 101100101 | 3 | 000010100 | 7 | 101100101 | 1 |
| 250 | 101101001 | 6 | 001011101 | 4 | 101101001 | 5 | 001011101 | 2 | 101101001 | 3 | 000010001 | 6 | 101101001 | 1 |
| 251 | 101101001 | 6 | 001011101 | 5 | 101101001 | 5 | 001011101 | 3 | 101101001 | 3 | 000010001 | 7 | 101101001 | 1 |
| 252 | 110010101 | 6 | 000101110 | 5 | 110010101 | 5 | 000101110 | 3 | 110010101 | 3 | 000001100 | 6 | 110010100 | 4 |
| 253 | 110010101 | 6 | 000111101 | 4 | 110010101 | 4 | 000111101 | 2 | 110010101 | 2 | 000001100 | 7 | 110010000 | 4 |
| 254 | 110100101 | 6 | 111000010 | 6 | 110100101 | 5 | 111000010 | 4 | 110100101 | 2 | 000001001 | 6 | 101010000 | 5 |
| 255 | 110100101 | 7 | 111000010 | 7 | 110100101 | 5 | 111000010 | 5 | 110100101 | 3 | 000001001 | 7 | 101010000 | 5 |

FIG. 2d-3

CONVERSION OF A SEQUENCE OF M-BIT INFORMATION WORDS INTO A MODULATED SIGNAL

BACKGROUND OF THE INVENTION

1. Field of the Invention

The invention relates to an apparatus for converting a sequence of m-bit information words into a modulated digital signal, where m is an integer, the apparatus comprising input means for receiving the sequence of m-bit information words, m-to-n bit converter means for converting the sequence of m-bit information words into a sequence of n-bit codewords, where n is an integer larger than m, the sequence of codewords forming the modulated signal, which signal comprises bit cells having a first signal value and bit cells having a second signal value, determining means for determining a coding state related to a digital sum value at the end of a modulated signal portion, which digital sum value denotes for said modulated signal portion a running value of a difference between the number of bit cells having the first signal value and the number of bit cells having the second signal value, the m-to-n bit converter means comprising selection means for selecting for the conversion a code word from a set of codewords that depends on the coding state, at least one of the digital sum values determining a first and a second coding state, the first and second coding state being determined in response to the information word that corresponds to the previous codeword and to a method for converting a sequence of m-bit information words into a modulated digital signal.

The invention further relates to a recording apparatus in which such a conversion apparatus is used.

The invention further relates to the modulated signal obtained and to a record carrier on which the modulated signal is recorded.

The invention furthermore relates to an apparatus for reconverting the modulated signal into a sequence of m-bit information words.

Finally, the invention relates to a reading apparatus in which a record carrier of this type is used.

2. Description of Related Art

A conversion apparatus as defined in the opening paragraph is known from WO 95/27,284, document D1 in the list of related documents that can be found at the end of the description.

Said document describes a modulation system in which a sequence of 8-bit information words is converted to a sequence of 9-bit code words. The sequence of 9-bit code words forms a modulated signal, which signal comprises bit cells having a first or a second signal value, such as a 'high' and a 'low' signal value representing the logical bit values '1' and '0' respectively in the codewords. Each bit cell represents a bit from the 9-bit codeword sequence, whilst the logical value of the bit is denoted by the signal value of the bit cell. On conversion, each time a 9-bit code word is delivered, together with a coding state, said coding state having a relation with a digital sum value for the delivered part of the modulated signal. This digital sum value denotes the difference between the number of 'high' bit cells and the number of 'low' bit cells for the delivered part of the modulated signal.

The next code word to be delivered is selected from a set of code words in dependence of the coding state derived with the previous codeword. The code words in the set are selected in such a way that the digital sum value of the modulated signal remains within a small range, which leads to the fact that the frequency spectrum of the signal has reduced frequency components in the low-frequency area. Such a signal is also referenced a DC-free signal or DC-balanced signal. The lack of low-frequency components in the signal generally has great advantages for information transfer via a record carrier or other transmission channels, such as eg. an optical fibre.

The conversion apparatus known from WO 95/27,284 provides for an increased information density on the record carrier.

The known apparatus, however, has the disadvantage that sometimes errors occur upon reconversion, resulting in a distorted reconverted sequence of information words.

SUMMARY OF THE INVENTION

It is an object of the invention to provide a conversion apparatus capable of generating a modulated signal such that the conversion-reconversion chain is less prone to errors.

In accordance with the invention, this object is achieved with the apparatus as claimed in claim 1.

The invention is based on the recognition that the errors that occur in the conversion and subsequent reconversion chain, result from an incorrect clock recovery in the reconversion apparatus, which clock frequency is recovered from the incoming modulated signal. In the known apparatus, the maximum runlength of the modulated signal is 9. The longer the maximum runlength is, the larger is the probability of occurrence of errors in the recovered clock frequency, resulting in more errors in the reconverted sequence of information words.

In accordance with the invention, the conversion apparatus is adapted to generate a modulated signal having a maximum runlength that does not exceed 7. This is a significant decrease compared to a maximum runlength of 9, as per the prior art conversion apparatus. Thus, the reliability of the clock recovery process in the reconversion apparatus is largely improved, resulting in a significant decrease in the occurrence of errors in the regenerated sequence of information words.

Preferably, apparatus as claimed in claim 1, wherein n is odd and equals m+1. This results in maintaining the advantage of a high information density, when recording the modulated signal on a record carrier.

The requirement of a smaller maximum runlength leads to another conversion table. Surprisingly, it was possible to generate such conversion table for the available number of $2^m$ information words, although the maximum runlength was decreased to 7.

In addition, other sync words are required in order to satisfy the same requirement for the maximum runlength. More specifically, the apparatus further comprises sync word generator means for generating a sync word for a block of p consecutive code words in the modulated signal, the sync word generator means being adapted to generate said sync word from the following set of available sync words:
11100011111110, 10100011111110, 01100011111110 and 11000100000001,
the sync word generator means being adapted to select one of the sync words in dependence of the coding state. The apparatus further comprises sync word generator means for generating a sync word for a block of p consecutive code words in the modulated signal, the sync word generator means being adapted to generate said sync word from the following set of available sync words:

111000111111110, 101000111111110, 011000111111110, 110001000000001, 010111000000001, 100111000000001, and 000111000000001 the sync word generator means being adapted to select one of the sync words in dependence of the coding state.

BRIEF DESCRIPTION OF THE DRAWINGS

These and other aspects of the invention will be apparent from and further elucidated with reference to the embodiments described in the following figure description, in which:

FIG. 2 and FIGS. 2a-1 to 2d-3 shows tables in which the relation between the information words and code words, in dependence of the coding state, is laid down;

FIG. 3 shows an embodiment for the conversion apparatus according to the invention;

DETAILED DESCRIPTION OF THE PREFERRED EMBODIMENTS

Figure 1:
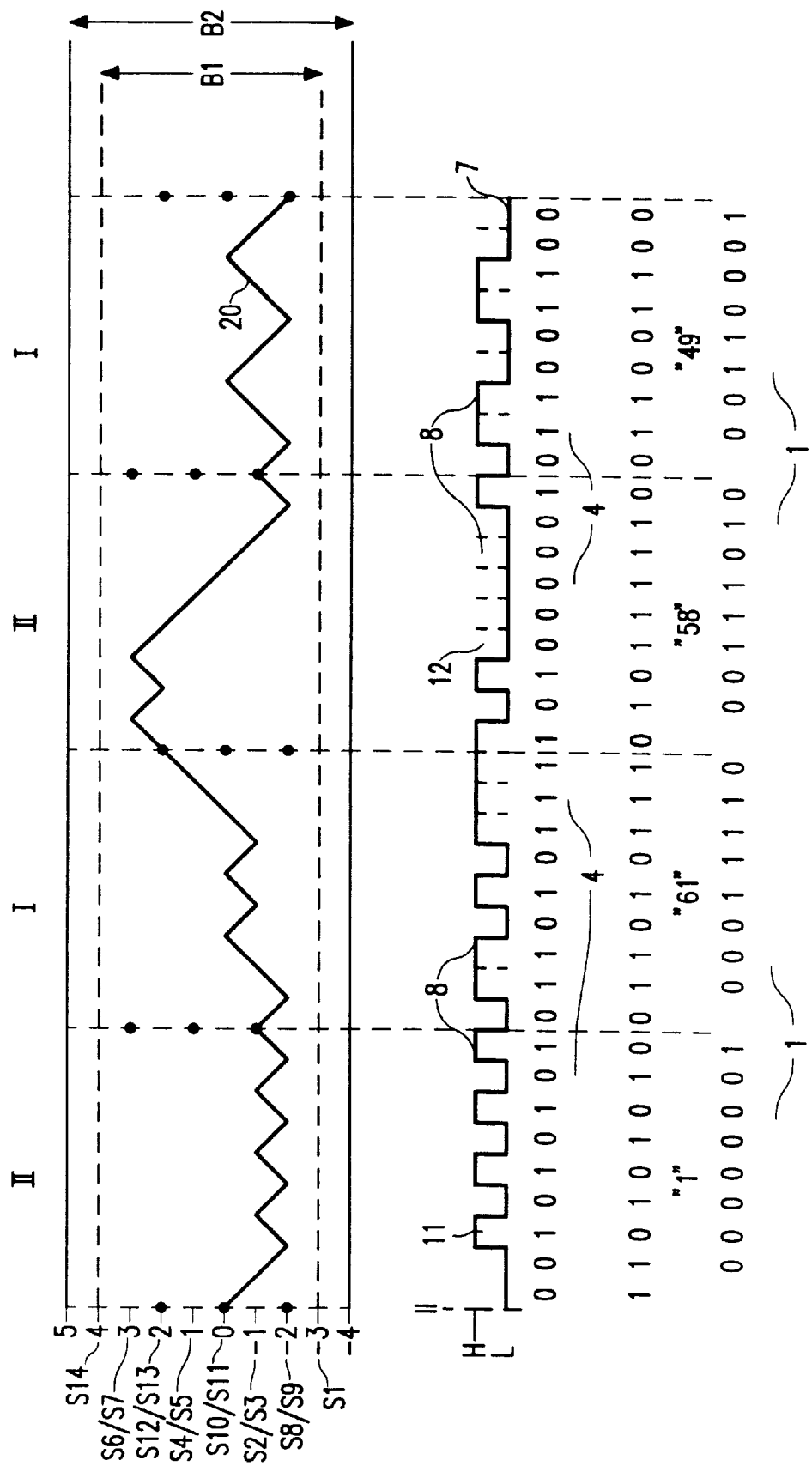
FIG. 1 shows a sequence of information words and the corresponding sequence of code words, resulting in the modulated signal.

FIG. 1 shows four successive m-bit information words, in this case 8-bit information words referenced 1. The four information words 1 have the respective decimal word values "1", "61", "58" and "49". This sequence of four information words 1 is converted to four successive n-bit code words, in this case 9-bit code words referenced 4. The code words 4 form a bit string of bits having a logical '0' value and bits having a logical '1' value. The conversion of the information words into codewords is such that, in the bit string of codewords, the number of consecutive bits having the same logical value is equal to 7 at the most. The individual bits of the code words will be referenced $x1, \ldots, x9$ in the following, where $x1$ indicates the first bit (from the left) of the code word and $x9$ the last bit of the code word.

The bit string of the code words 4 form the modulated signal 7. This modulated signal 7 contains four information signal portions 8 each representing one of the code words 4. The information signal portions 8 contain bit cells 11 which have a high signal value H and bit cells 12 which have a low signal value L. The number of bit cells for each information signal portion 8 is equal to the number of bits of the corresponding code word 4. Each codeword bit having a logical '1' value is indicated in the modulated signal 7 by one of the bit cells 11 having the high signal value H. Each codeword bit having the logical '0' value is indicated in the modulated signal 7 by one of the bit cells 12 having the low signal value L.

Furthermore, the requirement is made on the modulated signal 7 that the running digital sum value vary only within a limited range B2, which means that the frequency spectrum of the modulated signal 7 comprises substantially no low-frequency components. Worded differently, the modulated signal 7 is DC-free.

The digital sum value is in this respect meant to be understood as the difference between the number of preceding bit cells having a high signal value and the number of preceding bit cells having a low signal value. Worded differently, the digital sum value corresponds to the integrated value of the modulated signal.

FIG. 1 shows the variation of the digital sum value in curve 20. In FIG. 1 said range B2 in which the digital sum value varies, lies between −4 and +5.

In the embodiment described, the number of different values the digital sum value can assume at the ends of the signal portions 8 is equal to 8. These values lie in a range B1 bounded by the values −3 and +4. The number of consecutive bit cells having the same signal value, defined as the maximum runlength, is lower than given in the prior art coding device, namely 7. In spite of this restriction of the maximum runlength, it appeared to be possible to generate a conversion table, to be described later with reference to FIG. 2, for the conversion of all 256 8-bit information words.

The number of bits of the code words is odd, which means that the digital sum value at the ends of the signal portions 8 will be alternately odd and even. The code words in which the digital sum value at the beginning is even will be referenced even code words in the following. The code words in which the digital sum value at the beginning is odd will be referenced odd code words in the following. Periods of time in which an even code word is delivered will be referenced even periods II and periods of time in which an odd code word is delivered will be referenced odd periods I.

Hereafter there will be a detailed description of an embodiment for the method according to the invention by which the modulated signal 7 can be obtained.

Either one of the two digital sum values '−3' and '+4' at the end of each information portion determines a coding state of the second type. In the embodiment described the digital sum value '−3' determines the coding state S1 and the digital sum value '+4' the coding state S14. Each of the digital sum values '−2', '−1', '0', '1', '2', '3' refer to coding states of the first type.

More specifically, the coding states S8 and S9 both correspond to the digital sum value '−2'. After having converted an information word into a codeword, which resulted in the digital sum value of '−2', the coding state reached (S8 or S9, in this example) is determined by this digital sum value, as well as by the specific information word that has been converted last. The coding states S2 and S3 correspond to the digital sum value '−1'. After having converted an information word into a codeword, which resulted in the digital sum value of '−1', the coding state reached (S2 or S3, in this example) is determined by this digital sum value, as well as by the specific information word that has been converted last.

In the same way, the coding states S10 and S11 correspond to the digital sum value '0', the coding states S4 and S5 correspond to the digital sum value '1', the coding states S12 and S13 correspond to the digital sum value '2', and the coding states S6 and S7 correspond to the digital sum value '3'.

In the matrix T below, each element $t_{ij}$ denotes the number of different code words with which it is possible to abandon state i and enter state j.

| 0 | 0 | 0 | 0 | 0 | 0 | 0 | 90 | 90 | 69 | 69 | 27 | 27 | 3 |
|---|---|---|---|---|---|---|----|----|----|----|----|----|----|
| 0 | 0 | 0 | 0 | 0 | 0 | 0 | 54 | 54 | 55 | 55 | 40 | 40 | 18 |
| 0 | 0 | 0 | 0 | 0 | 0 | 0 | 63 | 63 | 65 | 65 | 36 | 36 | 9 |
| 0 | 0 | 0 | 0 | 0 | 0 | 0 | 41 | 41 | 56 | 56 | 55 | 55 | 37 |
| 0 | 0 | 0 | 0 | 0 | 0 | 0 | 38 | 38 | 68 | 68 | 65 | 65 | 32 |
| 0 | 0 | 0 | 0 | 0 | 0 | 0 | 20 | 20 | 41 | 41 | 54 | 54 | 42 |
| 0 | 0 | 0 | 0 | 0 | 0 | 0 | 10 | 10 | 38 | 38 | 63 | 63 | 48 |
| 48 | 63 | 63 | 38 | 38 | 10 | 10 | 0 | 0 | 0 | 0 | 0 | 0 | 0 |
| 42 | 54 | 54 | 41 | 41 | 20 | 20 | 0 | 0 | 0 | 0 | 0 | 0 | 0 |
| 32 | 65 | 65 | 68 | 68 | 38 | 38 | 0 | 0 | 0 | 0 | 0 | 0 | 0 |
| 37 | 55 | 55 | 56 | 56 | 41 | 41 | 0 | 0 | 0 | 0 | 0 | 0 | 0 |
| 9 | 36 | 36 | 65 | 65 | 63 | 63 | 0 | 0 | 0 | 0 | 0 | 0 | 0 |
| 18 | 40 | 40 | 55 | 55 | 54 | 54 | 0 | 0 | 0 | 0 | 0 | 0 | 0 |
| 3 | 27 | 27 | 69 | 69 | 90 | 90 | 0 | 0 | 0 | 0 | 0 | 0 | 0 |

This table has been obtained using the requirement that the maximum runlength is 7. Further some additional boundary conditions for the various codewords have been adopted, such as the codewords in states S1, S8 and S9 have at maximum 2 leading 'zeroes' and at maximum 5 leading 'ones', the codewords in states S2, S3, S10 and S11 have at maximum 3 leading 'zeroes' and at maximum 4 leading 'ones', the codewords in states S4, S5, S12 and S13 have at maximum 4 leading 'zeroes' and at maximum 3 leading 'ones', and the codewords in states S6, S7 and S14 have at maximum 5 leading 'zeroes' and at maximum 2 leading 'ones'.

Further, when the next state is S1, S8 or S9, the codewords have at maximum 2 trailing 'ones' and at maximum 5 trailing 'zeroes', when the next state is S2, S3, S10 or S11, the codewords have at maximum 3 trailing 'ones' and at maximum 4 trailing 'zeroes', when the next state is S4, S5, S12 or S13, the codewords have at maximum 4 trailing 'ones' and at maximum 3 trailing 'zeroes', and when the next state is S6, S7 or S14, the codewords have at maximum 5 trailing 'ones' and at maximum 2 trailing 'zeroes'.

Starting from an even digital sum value, always an odd sum value is reached and vice versa. The elements in the matrix denoting transitions from an even digital sum value to another even sum value and transitions from an odd sum value to another odd sum value are therefore all equal to "0". The matrix is also symmetrical. This is due to the case where a code word changes a computed first digital sum value into a computed second digital sum value, said second digital sum value is changed into the first digital sum value by the inverse of the code word concerned.

To each of the coding states S1, . . . S14 is assigned a set V1, . . . , V14 of code words, which contains a code word for each possible information word. In the case where the number of bits for each information word is equal to 8, each set thus contains 256 code words.

Furthermore, the sets of code words are selected such that the sets of code words established by the second coding states of the first type which belong to the same digital sum value, are disjunct, in other words, these sets have no code words whatsoever in common. In the embodiment shown, V2 and V3, V4 and V5, V6 and V7, V8 and V9, V10 and V11, V12 and V13 are pairs of disjunct sets.

The digital sum value '−1' always causes a code word from the set V2 or a code word from the set V3 to be assigned to the next information word to be converted. This means that during the information word conversion each of the code words leading to a digital sum value '−1' can be used twice. This code word (leading to the digital sum value '−1'), together with a random code word from the set V2, forms a bit combination that can be distinguished from the bit combination formed by the same code word and the random code word from the set V3. In similar fashion, each of the code words resulting in one of the digital sum values '+1', '+3', '−2', '0' and '+2' can be used twice for forming uniquely, together with the next word, two different information words.

All this means that the number of unique bit combinations is increased considerably, compared to coding systems in which each code word per se is to define an information word in a unique manner.

Since for a code word that changes the digital sum value from a first value to a second value always the inverse codeword value changes the digital sum value back from the second value to the first value, a set of code words can be assigned to one-half of the number of coding states, for example, the coding states belonging to a set of coding states determined by an odd digital sum value. The code words for the coding states determined by the even digital sum values may then be obtained by inverting the code words from the sets that belong to the coding states determined by the odd digital sum values. In the embodiment described here, the code words belonging to the coding state $S_i$ are the inverse of the code words belonging to the state $S_{15-i}$, where i is an integer greater than or equal to 1 and smaller than or equal to 14.

Figure 2:
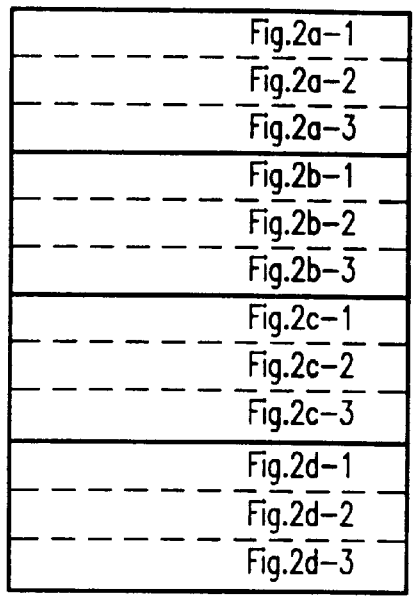

By way of illustration FIG. 2 shows in the first column the word values WW of all the 256 different 8-bit information words. The dedicated sets V1, V2, V3, V4, V5, V6 and V7 are shown in the respective second, fourth, sixth, eighth, tenth, twelfth and fourteenth columns.

The relations between the information words and code words in FIG. 2 are selected such that in the case where the same code word occurs in two or more of the sets V1, V2, V3, V4, V5, V6 and V7, this code word, combined with the next code word, as required, always establishes the same information word. This is advantageous in that on the recovery of the information words the corresponding coding states need not be determined, which results in little error propagation on the recovery of the information words. The disjunct sets belonging to the digital sum value can be distinguished in FIG. 2 on the basis of the bits x1 and x8 of the code words. In the code words in the sets belonging to the coding states S3, S5, S7, the logical values of bit x1 and bit x8 are not the same, whereas in the disjunct sets established by the corresponding coding states S2, S4 and S6, the bits x1 and x8 have the same logical value.

The digital sum value at the beginning of the code word uniquely determines, together with the codeword, the digital sum value at the end of the code word. This digital sum value at the end of this code word, combined with the converted information word, determines the coding state which is established at the end of the code word concerned. These coding states Sx which are determined at the end of each of the code words from the sets V1, V2, V3, V4, V5, V6 and V7 are shown in the respective third, fifth, seventh, ninth, eleventh, thirteenth and fifteenth columns, respectively.

The sets V14, V13, V12, V11, V10, V9 and V8 can be derived by a codeword inversion from the code words of the sets V1, V2, V3, V4, V5, V6 and V7, respectively. The coding states $S_i$ corresponding to the DSV value at the end of the code words, for i larger than 7, can be converted in accordance with the relation $S_{in}=S_{15-i}$, so as to obtain the coding state $S_{in}$ shown in the third, fifth, seventh, ninth, eleventh, thirteenth and fifteenth columns.

The conversion of the sequence of information words 1 to the sequence of code words 4 as shown in FIG. 1 can be explained by means of the Tables shown in FIG. 2. At the instant at which the first information word (word value '1') is to be converted, the digital sum value is equal to '0'. This means that the code word is to be selected from the set V10 or V11, depending on the information word that was encoded directly prior to the information word '1'. Assuming that this information word, together with the digital sum value '0', determines the coding state S11, the code word corresponding to the information word '1' is to be selected from set V11. Based upon the conversion rule given above, the desired code word may be obtained by inversion of the code word '11010101010' which is assigned to the information word having the word value '1' in the set V4 $(S_{in})=S_{15-11})=S_4$). The code word thus obtained is then equal to '001010101'. The coding state at the end of the code word corresponding to the information word '1' is then S3. This follows directly from column 9 in table 2. This also follows more or less directly from FIG. 1, in the sense that at the end of the codeword corresponding to the encoded information word '1', the DSV equals −1, which corresponds to a state of either S2 or S3, as per FIG. 1. It is the state S3, as encoding the information word '0', instead of the information word '1', which results in the same codeword, would have led to the state S2, see also the table of FIG. 2.

Being in the coding state S3, this means that the next code word is to be selected from set V3. The next information word to be converted has the word value '61', which means that the next code word is equal to '011010111'. In accordance with column 7 in the table of FIG. 2, the next coding state is equal to S3. This again corresponds with FIG. 1, which shows that the DSV equals 2 at the end of the codeword corresponding to the information word '61'. This DSV value corresponds to either state S12 or S13. It is state S12, as encoding the information word '60', instead of the information word '61', which results in the same codeword, would have led to the state S13, see also the table of FIG. 2.

Being in the coding state S12, this means that the next code word is the inverse of the code word assigned to the next information word in the set V3, as $S_{in}=S_{15-12}$. In this case the word value of the next information word is '58'. The dedicated code word in the set V3 is '010111110'. The information word is converted to the inverse of this code word and thus to '101000001'. The next coding state then becomes equal to S2, see column 7 in the tables of FIG. 2. The code word for the next information word to be converted is thus to be selected from the set V2. This information word to be converted has the word value "49", so that the dedicated code word is equal to '011001100'.

Figure 3:
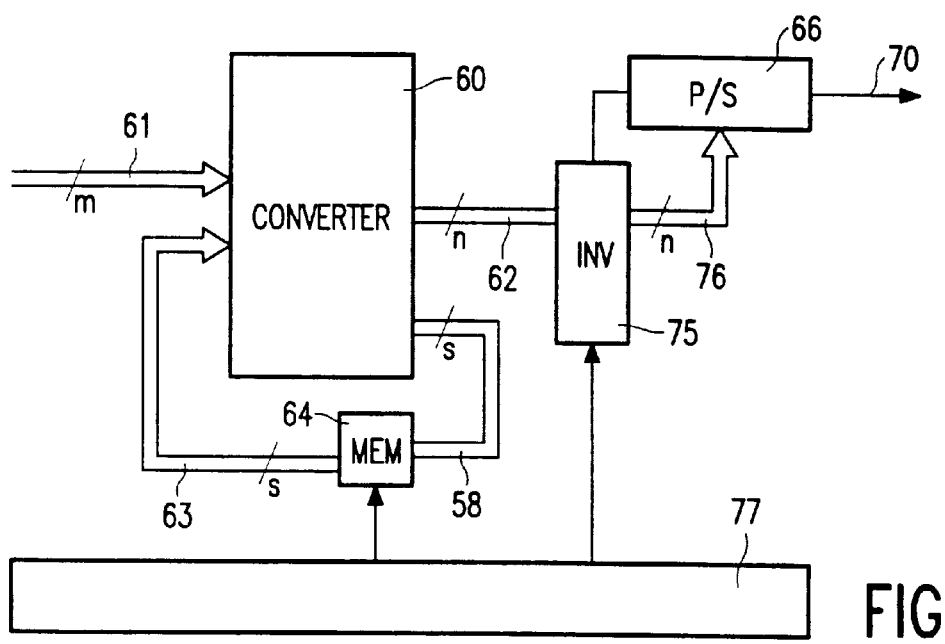

FIG. 3 shows an embodiment for a conversion apparatus 140 according to the invention by which the method described above can be implemented. The conversion apparatus is arranged for converting the m-bit information words 1 to the m-bit code words 4, whilst the number of different coding states can be denoted by s bits. The conversion apparatus comprises a converter 60 for converting (m+s) binary input signals to (n+s) binary output signals. From the inputs of the converter m inputs are connected to a bus 61 for receiving m-bit information words. From the outputs of the converter n outputs are connected to a bus 62 for supplying n-bit code words. Furthermore, s inputs are connected to an s-bit bus 63 for receiving a state word denoting the current coding state. The state word is produced by a buffer memory 64, for example, in the form of s-flip flops. The buffer memory 64 has s inputs connected to a bus 58 for receiving a state word to be loaded in the buffer memory. For transporting the state word to be loaded in the buffer memory, s outputs of the converter 60 are used which are connected to the bus 58.

The bus 62 is connected to a controllable inverter circuit 75 of a customary type which, in response to a control signal on its input, inverts or not the n-bit code words received over bus 62 and conveys them to a bus 76. The bus 76 is connected to parallel inputs of a parallel/serial converter 66. The parallel/serial converter 66 converts the n-bit code words received over bus 76 into a serial datastream, which is the modulated signal 7 supplied over a signal line 70.

The converter 60 may comprise a ROM memory which stores the code word sets shown in FIG. 2 in the form of a so-termed look-up tables at addresses established by the combination of state word and information word applied to the inputs of converter.

The converter 60 may comprise, in lieu of a ROM memory, a combinatorial logical circuit formed by gate circuits.

The synchronization of the operations performed in the device may be obtained in customary fashion with synchronized clock signals which may be generated by a clock generation circuit 77. The clock generation circuit 77 causes, by applying the control signal to the inverter circuit 75, the code words delivered by the converter for the even periods II to be inverted by the inverter circuit 75 and the code words delivered by the converter 60 for the odd periods I to be delivered unchanged by the converter 60.

In the embodiment shown the new coding state is directly delivered by the converter. In principle, however, it is alternatively possible that the new coding state is derived by computing the digital sum value at the end of each delivered code word and to derive the new coding state based upon the digital sum value thus computed. In that case the device is to comprise a unit for computing the digital sum values as well as a unit which applies a corresponding state word to the buffer memory 64 based upon the computed digital sum value.

Sync words are added to blocks of codewords of the modulated signal 7. The sync words preferably have a signal pattern that cannot occur in a random sequence of information signal portions. Equally preferably, parts of the sync words together with a part of an adjacent information signal portion, cannot form a signal pattern that corresponds to the pattern of the sync words. The sync words are inserted into the sequence of n-bit code words. The table below shows seven 14-bit sync words which are pre-eminently suitable for use in combination with the code words shown in FIG. 2.

| 1 | 11100011111110 | 6 |
| 2 | 10100011111110 | 6 |
| 3 | 01100011111110 | 6 |
| 4 | 01011100000001 | 1 |
| 5 | 10011100000001 | 1 |
| 6 | 00011100000001 | 1 |
| 7 | 11000100000001 | 1 |

The first column of the table shows coding states. The second column in the Table shows the sync words dedicated to this coding state. The third column shows the coding state adopted after the sync word has been delivered.

The sync words delivered at the coding states S2, S4, S6 can be distinguished on the basis of the bits x1 and x8 from the sync words delivered at the coding states S3, S5 and S7 in the same way as the code words coming after these coding states can be distinguished. At the coding states S2, S4 and S6 a sync word is delivered for which the logical value of the bits x1 and x8 is the same. In the sync words delivered at the coding states S3, S5 and S7, the logical value of the bits x1 and x8 is not the same.

From the sync words listed above, it is clear that some of them are the inverse of others. A sync word generator may thus be required that generates the sync words 11100011111110, 10100011111110, 01100011111110, and 11000100000001.

With the addition of sync words to the sequence of codewords, the matrix T given above will change.

In the matrix T below, each element $t_{ij}$ denotes the number of different code words with which it is possible to abandon state i and enter state j, when also having sync words in the sequence of codewords.

| 0 | 0 | 0 | 0 | 0 | 0 | 0 | 87 | 87 | 68 | 68 | 25 | 25 | 2 |
|---|---|---|---|---|---|---|----|----|----|----|----|----|---|
| 0 | 0 | 0 | 0 | 0 | 0 | 0 | 54 | 54 | 54 | 54 | 39 | 39 | 18 |
| 0 | 0 | 0 | 0 | 0 | 0 | 0 | 61 | 61 | 64 | 64 | 36 | 36 | 8 |
| 0 | 0 | 0 | 0 | 0 | 0 | 0 | 40 | 40 | 56 | 56 | 55 | 55 | 36 |
| 0 | 0 | 0 | 0 | 0 | 0 | 0 | 38 | 38 | 67 | 67 | 64 | 64 | 32 |
| 0 | 0 | 0 | 0 | 0 | 0 | 0 | 20 | 20 | 40 | 40 | 53 | 53 | 42 |
| 0 | 0 | 0 | 0 | 0 | 0 | 0 | 9 | 9 | 38 | 38 | 62 | 62 | 48 |
| 48 | 62 | 62 | 38 | 38 | 9 | 9 | 0 | 0 | 0 | 0 | 0 | 0 | 0 |
| 42 | 53 | 53 | 40 | 40 | 20 | 20 | 0 | 0 | 0 | 0 | 0 | 0 | 0 |
| 32 | 64 | 64 | 67 | 67 | 38 | 38 | 0 | 0 | 0 | 0 | 0 | 0 | 0 |
| 36 | 55 | 55 | 56 | 56 | 40 | 40 | 0 | 0 | 0 | 0 | 0 | 0 | 0 |
| 8 | 36 | 36 | 64 | 64 | 61 | 61 | 0 | 0 | 0 | 0 | 0 | 0 | 0 |
| 18 | 39 | 39 | 54 | 54 | 54 | 54 | 0 | 0 | 0 | 0 | 0 | 0 | 0 |
| 2 | 25 | 25 | 68 | 68 | 87 | 87 | 0 | 0 | 0 | 0 | 0 | 0 | 0 |

The next table shows the runlength distribution of the new coding method compared to the runlength distribution of the coding method described in WO 95127,284.

| runlength (in # bits) | runlength distribution of new method | runlength distribution of known method |
|---|---|---|
| 1 | 0.5104302 | 0.5150166 |
| 2 | 0.2770573 | 0.2772678 |
| 3 | 0.1348177 | 0.1306489 |
| 4 | 0.0552561 | 0.0519760 |
| 5 | 0.0182932 | 0.0191180 |
| 6 | 0.0037600 | 0.0049965 |
| 7 | 0.0003854 | 0.0008885 |
| 8 | 0.0000000 | 0.0000833 |
| 9 | 0.0000000 | 0.0000044 |

It should be noted here, that the results given in the above table are from modulated signals without any sync words in them.

The table shows that runlengths larger than 7 do not occur in the new coding method and that further, runlengths of 5, 6 and 7 bits occur less frequently in the new coding method than in the prior art coding method. This results in a better clock recovery property for the new coding method.

Figure 4:
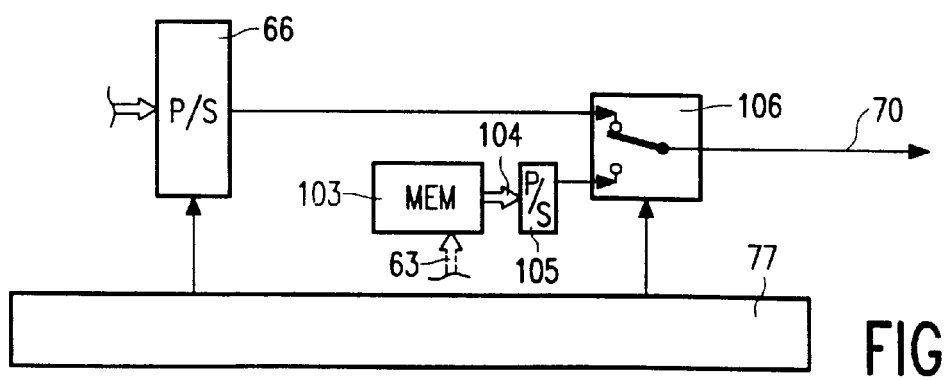
FIG. 4 shows a modification of the conversion apparatus of FIG. 3 for inserting sync signals.

FIG. 4 shows a modification of the conversion apparatus shown in FIG. 3, by which sync words can be inserted in the manner described above. In FIG. 4 the components identical with the components shown in FIG. 3 have like reference characters. The modification relates to a memory 103 having seven memory locations which each accommodate one of the seven sync words from the table. The memory 103 comprises an addressing circuit for addressing one of the seven memory locations in response to the state word received over bus 63 on address inputs of the memory 103. The sync word in the addressed memory location is applied to a parallel/serial converter 105 over a bus 104. The serial output of the converter 105 is applied to a first input of an electronically operable switch unit 106. The serial output of the parallel/serial converter 66 is connected to a second input of the switch unit 106. The conversion apparatus is controlled by the control circuit 77 adapted for this purpose to alternately bring the conversion apparatus into a first and a second mode. In the first mode, a predefined number of information words is converted to code words which are serially applied to the signal line 70 via the switch unit 106. At the transition from the first to the second mode, the conversion of information words is interrupted and the sync word established by the state word is delivered by the memory 103 and applied to the signal line 70 via the parallel/serial converter 105 and switch unit 106. In addition, at the transition from the second to the first mode, the buffer memory 64 is loaded, under the control of the control circuit 77, with the new coding state determined by the delivered sync word, after which the conversion from information words to code words is resumed until the conversion apparatus is again brought to the second mode by the control circuit 77.

Figure 5:
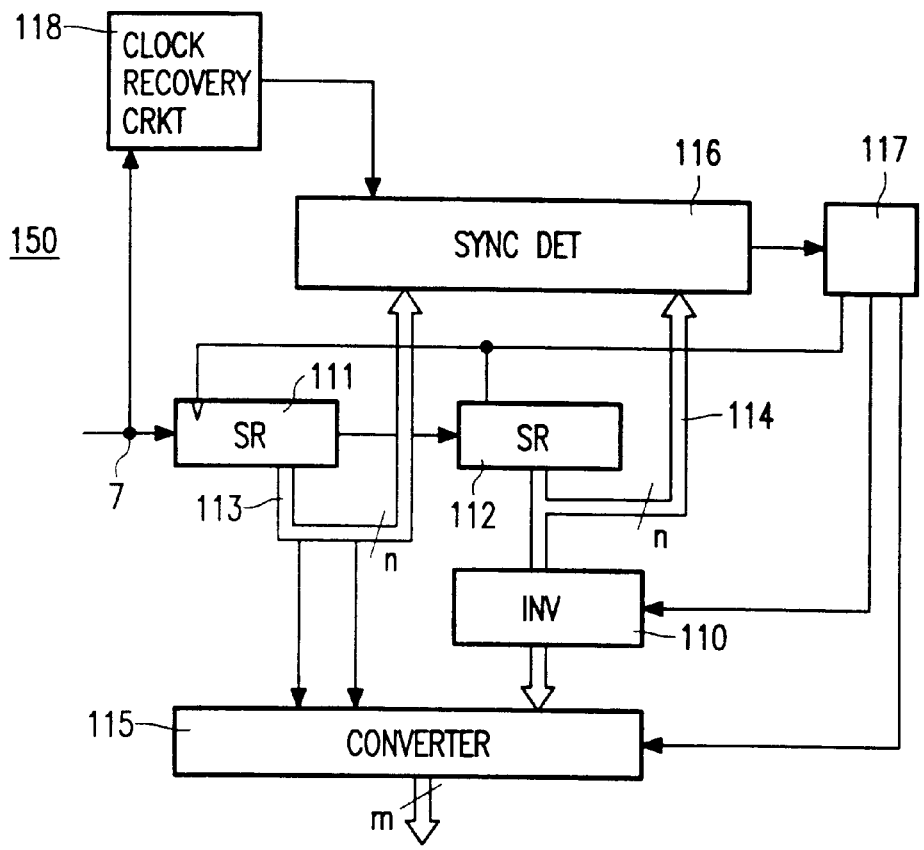
FIG. 5 shows a reconversion apparatus.

FIG. 5 shows an embodiment for a reconversion apparatus 150 according to the invention, for reconverting the modulated signal obtained by the implementation of the methods described above to a sequence of information words. The reconversion apparatus comprises two series-arranged shift registers to which the modulated signal 7 is applied. Each of the shift registers 111 and 112 has a length corresponding to the length of an n-bit code word. The contents of the shift registers 111 and 112 are fed to respective buses 113 and 114 through parallel outputs. The reconversion apparatus comprises an (n+p)-to-m-bit converter 115. All the n bits available in the shift register 112 are applied to inputs of the converter 115 via the bus 114 and a controllable inverter circuit 110. From the n bits available in the shift register 111, the p bits that together with the n bits in the shift register 114 uniquely establish an information word are applied to the converter 115. In this example they are the bits x1 and x8. The converter 115 may comprise a memory with a look-up table that contains an m-bit information word for each permitted bit combination formed by the n bits of an n-bit code word and the predefined p bits of a bit string portion following this code word. The converter 115 may also be formed by gate circuits, however. As the controllable inverter circuit 110 is inserted between the outputs of register 112 and the inputs of the converter 115, the converter 115 only needs to be capable of processing code words from the sets V1 to V7. For that matter, the code words in the odd periods I are inverse to the code words in the even periods II. The reconversion apparatus is then to comprise means for alternately activating (in the even periods) and deactivating (in the odd periods) the inverter circuit 110. The inverter circuit 110 is of a customary type which, in deactivated state, transfers the code words received on its input unmodified to the converter 115. In active state the inverter circuit 1 10 transfers the received code words in inverse form to the converter 115.

The control of the inverter circuit 10 and the conversions carried out by the converter 115 may be synchronized in a customary manner by a synchronizing circuit 117, so that each time a code word as a whole is loaded in the shift register 112, the information word corresponding to the bit combination applied to the inputs of the converter 115 is available on the outputs of the converter.

Preferably, a sync word detector 116 connected to the buses 113 and 114 and detecting the bit patterns corresponding to the sync words is used during the synchronization process.

In order for the sync word detector 116 to function properly, a clock signal which has a relation to the bitfrequency may be applied to the sync word detector 116. This clock signal is supplied by a clock signal recovery circuit 118, which clock recovery circuit generates the clock signal from the incoming modulated signal 7. In general, it can be said that for all other functions in the apparatus, such as the bit detection itself, the clock recovery by the recovery circuit 118 should be very accurate.

Figure 6:
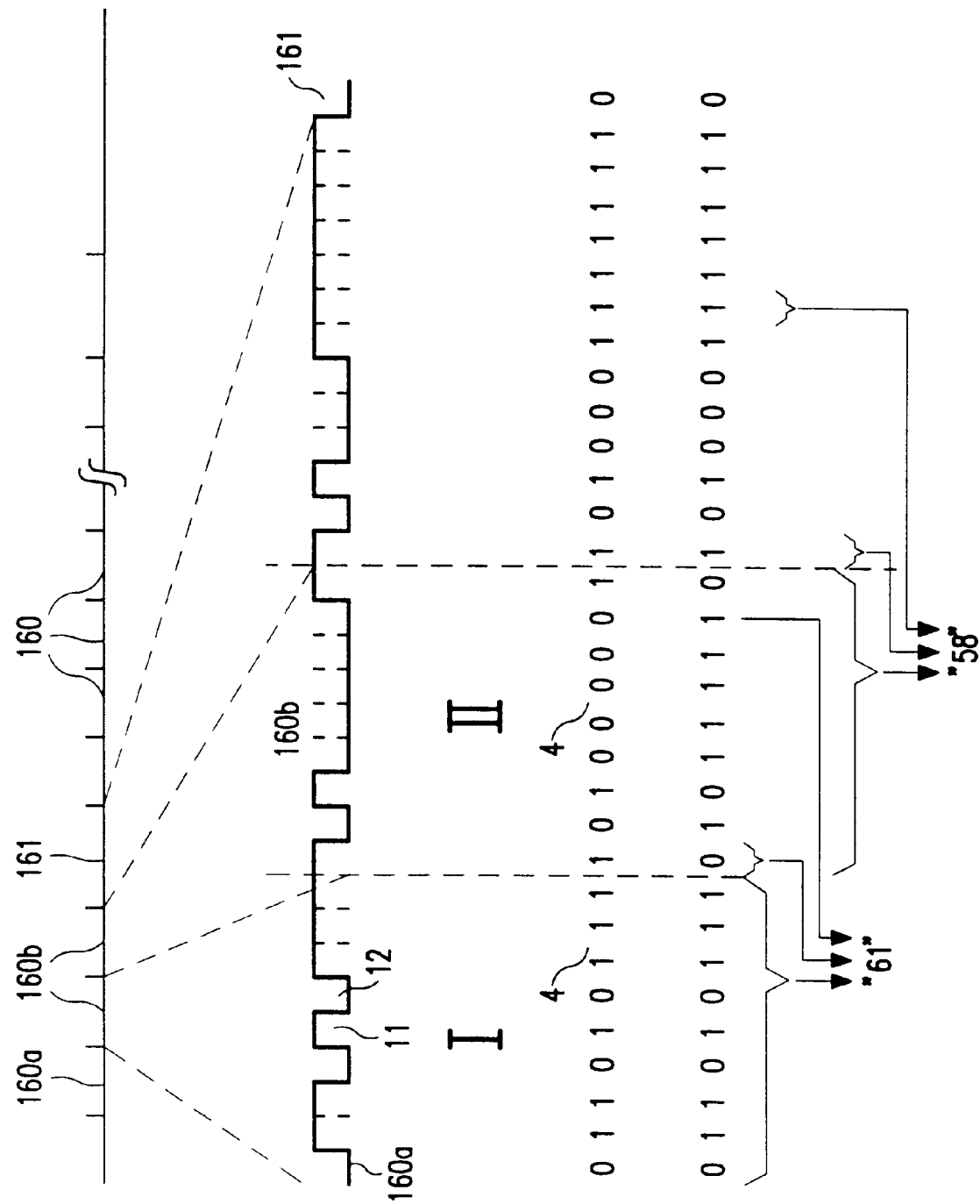
FIG. 6 shows portions of a modulated signal and the corresponding information words derived therefrom.

By way of illustration, FIG. 6 shows a signal which can be obtained with the invented method described above. The signal comprises a sequence of q successive information signal portions 160, where q is an integer, which portions represent q information words. Sync words, of which FIG. 6 shows one, referenced 161, are inserted between blocks of codewords. A plurality of information signal portions 160 are shown in detail. Each of the information signal portions 160 contains n bit cells, in this case 9, which have a first (low) signal value L or a second (high) signal value H. The number of successive bit cells having the same signal value is equal to 1 at the least and equal to 7 at the most. Due to the digital sum value-dependent selection of the code words the running value of the difference between the number of bit cells having the first signal value and the bit cells having the second signal value at a random point in the signal is substantially constant in the signal portion preceding this point. Each information signal portion 160 resulting in either of the digital sum values '−3' or '4', uniquely establishes an information word. Each information signal portion representing a code word which results in one of the digital sum values from '−2' to '3', together with an adjacent signal portion, uniquely establishes an information word.

In FIG. 6 they are, for example, the information signal portions 160a and 160b. These information signal portions, together with the bit cells on the first and eighth positions of a next signal portion, establish the information words having the word values '61' and '58'.

Figure 7:
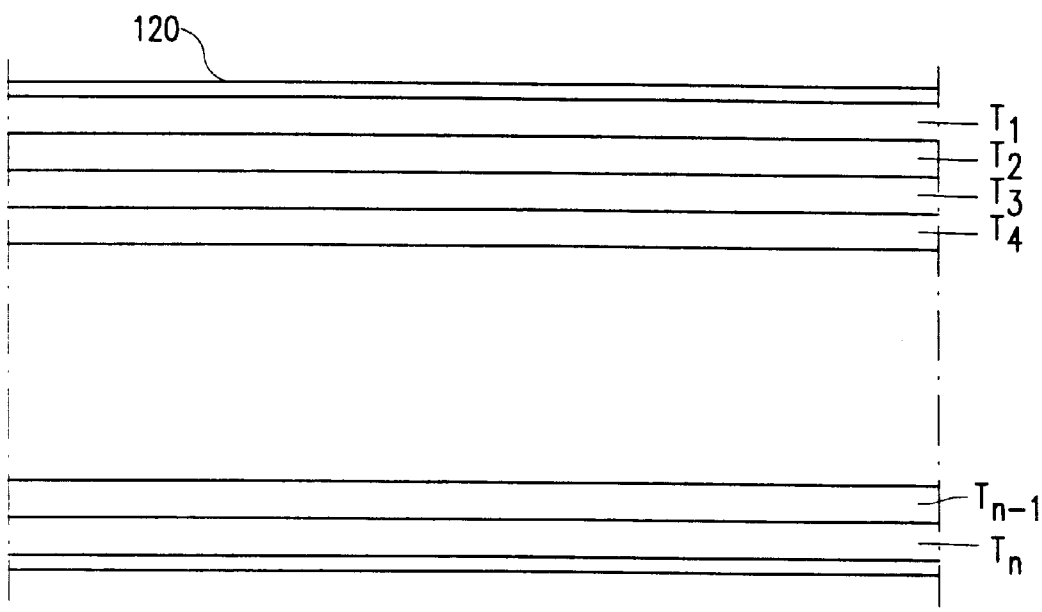
FIG. 7 shows a record carrier.

FIG. 7 shows, by way of example, a portion of a record carrier 120 according to the invention. The record carrier shown is one of the magnetically detectable type. The record carrier may, however, also be of a different type, for example, a optically detectable type. The record carrier shown is tape-like shaped. However, the invention may also be applied to disk-like record carriers. The record carrier 120 contains tracks T1, T2, T3, . . . running parallel to each other in the longitudinal direction of the record carrier, in which tracks the modulated signal can be recorded.

Figure 8:
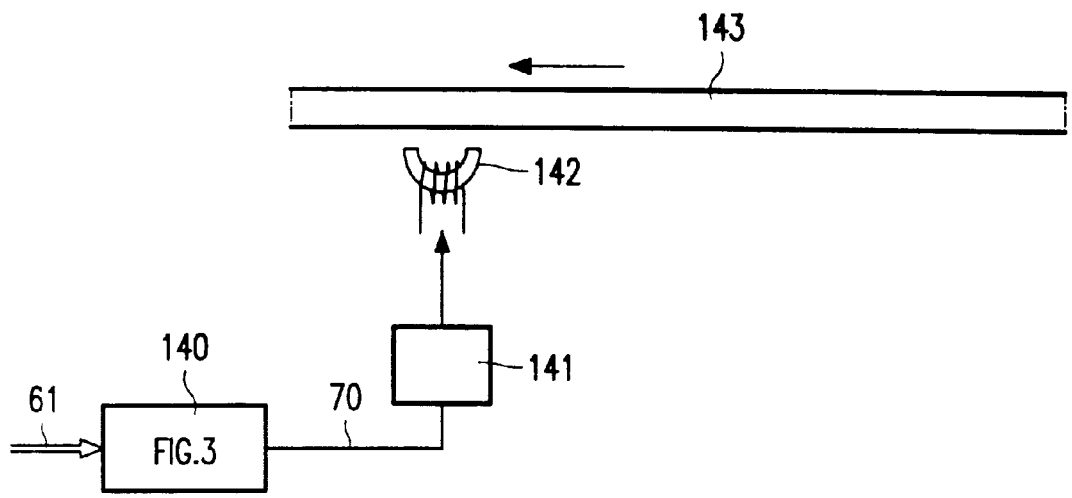
FIG. 8 shows a recording apparatus.

FIG. 8 shows a recording apparatus for information recording, in which the conversion apparatus according to the invention is used, for example, the conversion apparatus 140 shown in FIG. 3. In the recording apparatus the signal line for delivering the modulated signal is connected to a control circuit 141 for a write head 142, along which a record carrier 143 of an inscribable type is moved in a direction indicated by the arrow. The write head 142 is a magnetic write head which is capable of writing the modulated signal in a track on the record carrier 143. The control circuit 141 may likewise be of a customary type generating a write signal for the write head in response to the modulated signal applied to the control circuit 140, so that the write head 142 realises a magnetic pattern in the track corresponding to the modulated signal.

Figure 9:
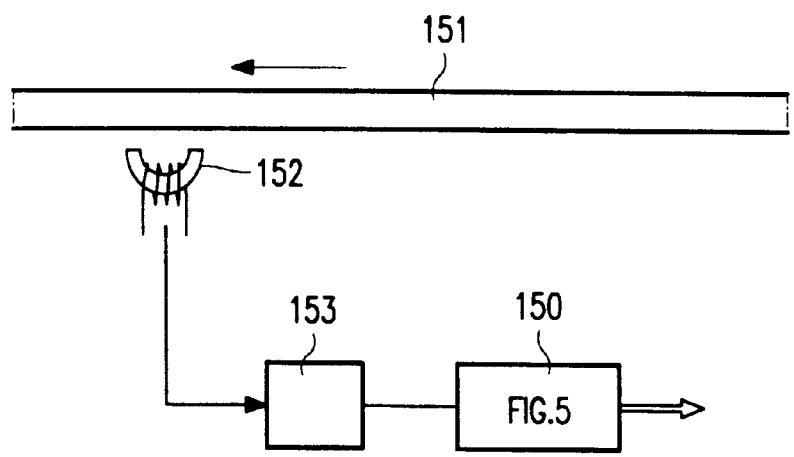
FIG. 9 shows a reading apparatus.

FIG. 9 shows a reproducing apparatus in which a reconversion apparatus according to the invention is used, for example, the reconversion apparatus 150 shown in FIG. 5. The reproducing apparatus comprises a read head 152 of a customary type for reading a record carrier according to the invention on which an information pattern corresponding to the modulated signal is written. With it the read head 152 produces an analog read signal which is converted to a binary signal in the circuit 153, which binary signal is subsequently fed to the reconversion apparatus 150. The circuit 153 may comprise, for example, a so-termed partial response detector.

Whilst the present invention has been described with respect to preferred embodiments thereof, it is to be understood that these are not limitative examples. Thus, various modifications may become apparent to those skilled in the art, without departing from the scope of the invention, as defined in the appended claims.

Further, the invention lies in each and every novel feature and combination of features.

The conversion/reconversion apparatuses described are very well suitable in multitrack recording/reproduction apparatuses, as described in EP pat. appln. no. 95202926.2, document D2, EP pat. appln. no. 95203028.6, document D3, EP pat. appln. no. 95203029.4, document D4, EP pat. appln. no. 95203192.0, document D5 and EP pat. appln. no. 95203380.1, document D6, in the list of related documents. Further, the invention is equally well applicable in transmission systems for transmitting the modulated signal via a transmission medium, such as an optical fibre, see EP-A 97,763, document D7 in the list of related documents.

Related Documents (D1) WO 95/27,284 (PHN 14,789)

(D2) EP pat. appln. no. 95202926.2 (PHN 15.520), filing date Oct. 30, 1995

(D3) EP pat. appln. no. 95203028.6 (PHN 15.543), filing date Nov. 8, 1995

(D4) EP pat. appln. no. 95203029.4 (PHN 15.545), filing data Nov. 8, 1995

(D5) EP pat. appln. no. 95203192.0 (PHN 15.563), filing date Nov. 21, 1995

(D6) EP pat. appln. no. 95203380.1 (PHN 15.594), filing date Dec. 7, 1995

(D7) EP-A 97,763

I claim:

1. An apparatus for converting a sequence of m-bit information words into a modulated digital signal, where m is an integer, the apparatus comprising input means for receiving the sequence of m-bit information words, m-to-n bit converter means for converting the sequence of m-bit information words into a sequence of n-bit codewords, where n is an integer larger than m, the sequence of codewords forming the modulated signal, which signal comprises bit cells having a first signal value and bit cells having a second signal value, determining means for determining a coding state related to a digital sum value at the end of a modulated signal portion, which digital sum value denotes for said modulated signal portion a running value of a difference between the number of bit cells having the first signal value and the number of bit cells having the second signal value, the m-to-n bit converter means comprising selection means for selecting for the conversion a code word from a set of codewords that depends on the coding state, at least one of the digital sum values determining a first and a second coding state, the first and second coding state being determined in response to the information word that corresponds to the previous codeword, wherein the apparatus is adapted to form a modulated signal satisfying the requirement that the number of consecutive bit cells in the modulated signal having the same signal value does not exceed 7.

2. An apparatus as claimed in claim 1, wherein n is odd and equals m+1.

3. An apparatus as claimed in claim 2, wherein m is equal to 8 and n is equal to 9.

4. An apparatus as claimed in claim 1, the apparatus further comprising sync word generator means for generating a sync word for a block of p consecutive code words in the modulated signal, the sync word generator means being adapted to generate said sync word from the following set of available sync words:
11100011111110, 10100011111110, 01100011111110 and 11000100000001,
the sync word generator means being adapted to select one of the sync words in dependence upon the coding state.

5. An apparatus as claimed in claim 1, the apparatus further comprising
sync word generator means for generating a sync word for a block of p consecutive code words in the modulated signal, the sync word generator means being adapted to generate said sync word from the following set of available sync words:
11100011111110, 10100011111110, 01100011111110, 11000100000001, 01011100000001, 10011100000001, and 00011100000001
the sync word generator means being adapted to select one of the sync words in dependence upon the coding state.

6. An apparatus as claimed in claim 5, the sync word generator means being adapted to generate the following sync words:

| 1 | 11100011111110 | 6 |
| 2 | 10100011111110 | 6 |
| 3 | 01100011111110 | 6 |
| 4 | 01011100000001 | 1 |
| 5 | 10011100000001 | 1 |
| 6 | 00011100000001 | 1 |
| 7 | 11000100000001 | 1 | where the value in the first column indicates the coding state after having converted the information word directly preceding the sync word to be added, the bit sequence in the second column indicates the sync word generated in response to said coding state and the value in the third column indicates the coding state required to obtain the codeword directly following the sync word.

7. An apparatus as claimed in claim 4, wherein the sync words generated present bit patterns that cannot occur in the bit sequence of the codewords.

8. An apparatus as claimed in claim 2, wherein the sets of code words belonging to each pair of coding states of the first type are disjunct.

9. An apparatus as claimed in claim 8, wherein the sets of code words belonging to the pairs of coding states of the first type are mutually distinguishable based upon the logical values of bits on p predefined positions in the code words, where p is an integer smaller than or equal to n.

10. A recording apparatus for recording a modulated signal in a track on a record carrier, comprising a conversion apparatus for converting a sequence of m-bit information words into a modulated digital signal, where m is an integer, the apparatus comprising input means (61) for receiving the sequence of m-bit information words, m-to-n bit converter means (60) for converting the sequence of m-bit information words into a sequence of n-bit codewords, where n is an integer larger than m, the sequence of codewords forming the modulated signal, which signal comprises bit cells having a first signal value and bit cells having a second signal value, determining means (60,64,77) for determining a coding state related to a digital sum value at the end of a modulated signal portion, which digital sum value denotes for said modulated signal portion a running value of a difference between the number of bit cells having the first signal value and the number of bit cells having the second signal value, the m-to-n bit converter means comprising selection means for selecting for the conversion a code word from a set of codewords that depends on the coding state (63), at least one of the digital sum values determining a first and a second coding state, the first and second coding state being determined in response to the information word that corresponds to the previous codeword, wherein the conversion apparatus is adapted to form a modulated signal satisfying the requirement that the number of consecutive bit cells in the modulated signal having the same signal value does not exceed 7, said apparatus further comprising writing means for writing the modulated signal in said track on the record carrier.

11. A method for converting a sequence of m-bit information words into a modulated digital signal, where m is an integer, the method comprising the steps of receiving the sequence of m-bit information words, converting the sequence of m-bit information words into a sequence of n-bit codewords, where n is an integer larger than m, the sequence of codewords forming the modulated signal, which signal comprises bit cells having a first signal value and bit cells having a second signal value, determining a coding state related to a digital sum value at the end of a modulated signal portion, which digital sum value denotes for said modulated signal portion a running value of a difference between the number of bit cells having the first signal value and the number of bit cells having the second signal value, the converter step comprising the substep of selecting for the conversion a code word from a set of codewords that depends on the coding state (63), at least one of the digital sum values determining a first and a second coding state, the first and second coding state being determined in response to the information word that corresponds to the previous codeword, wherein the modulated signal satisfies the requirement that the number of consecutive bit cells in the modulated signal having the same signal value does not exceed 7.

12. A record carrier obtained with the recording apparatus as claimed in claim 10.

13. An apparatus for reconverting a modulated signal into a sequence of m-bit information words, where m is an integer, the apparatus comprising input means for receiving the modulated signal comprising a sequence of n bit codewords, n-to-m bit converter means for converting the sequence of n-bit codewords into a sequence of m-bit information words by assigning an information word to a codeword to be converted in dependence of said codeword to be converted, where n is an integer larger than m, the converter means being adapted to assign the information word to a codeword in dependence of the logical values of the bits in the bitstring which are situated at p predefined positions with respect to the corresponding codeword, and where the modulated signal satisfies the requirement that the number of consecutive bit cells in the modulated signal having the same signal value does not exceed 7.

14. An apparatus as claimed in claim 13, wherein the apparatus comprises sync word detector means for detecting sync words present in the modulated signal having the following bit patterns:
11100011111110, 10100011111110, 01100011111110, and 11000100000001.

15. An apparatus as claimed in claim 13, wherein the apparatus comprises sync word detector means for detecting sync words present in the modulated signal having the following bit patterns:
11100011111110, 10100011111110, 01100011111110, 11000100000001, 01011100000001, 10011100000001, and 00011100000001.

16. An apparatus as claimed in claim 6, wherein the sync words generated present bit patterns that cannot occur in the bit sequence of the codewords.

17. An apparatus as claimed in claim 4, wherein the sets of code words belonging to each pair of coding states of the first type are disjunct.

18. An apparatus as claimed in claim 6, wherein the sets of code words belonging to each pair of coding states of the first type are disjunct.

19. An apparatus as claimed in claim 18, wherein the sets of code words belonging to the pairs of coding states of the first type are mutually distinguishable based upon the logical values of bits on p predefined positions in the code words, where p is an integer smaller than or equal to n.

* * * * *